United States Patent
Matsuura et al.

(10) Patent No.: US 7,944,994 B2
(45) Date of Patent: May 17, 2011

(54) DATA CONVERTER AND DATA CONVERSION METHOD, AND TRANSMITTER CIRCUIT, COMMUNICATIONS DEVICE AND ELECTRONIC DEVICE USING THE SAME

(75) Inventors: Toru Matsuura, Sakai (JP); Hisashi Adachi, Mino (JP)

(73) Assignee: Panasonic Corporation, Osaka (JP)

( * ) Notice: Subject to any disclaimer, the term of this patent is extended or adjusted under 35 U.S.C. 154(b) by 979 days.

(21) Appl. No.: 11/037,303

(22) Filed: Jan. 19, 2005

(65) Prior Publication Data
US 2005/0163253 A1    Jul. 28, 2005

(30) Foreign Application Priority Data
Jan. 22, 2004   (JP) ................. 2004-014821

(51) Int. Cl.
*H04L 27/00* (2006.01)
(52) U.S. Cl. ........................ 375/302; 375/295
(58) Field of Classification Search ............... 375/295, 375/296, 302, 300; 330/10
See application file for complete search history.

(56) References Cited

U.S. PATENT DOCUMENTS

| | | | | |
|---|---|---|---|---|
| 6,650,878 B1 * | 11/2003 | Abe et al. | | 455/232.1 |
| 2002/0131523 A1 * | 9/2002 | Nagasaka et al. | | 375/297 |
| 2003/0184372 A1 * | 10/2003 | Fudaba et al. | | 330/149 |
| 2004/0263245 A1 * | 12/2004 | Winter et al. | | 330/10 |

FOREIGN PATENT DOCUMENTS

| | | |
|---|---|---|
| JP | 2002-325109 | 11/2002 |
| JP | 2004-072734 | 3/2004 |

* cited by examiner

*Primary Examiner* — Kevin M Burd
(74) *Attorney, Agent, or Firm* — Wenderoth, Lind & Ponack, L.L.P.

(57) ABSTRACT

A data converter that converts an input signal to a signal to be inputted to an amplifier. Specifically, the data converter includes: an amplitude detection section that detects an amplitude level of the input signal; a region determination section that determines whether or not an input power to the amplifier is in a non-linear region of the amplifier based on the amplitude level of the input signal detected by the amplitude detection section; and a signal processing section that converts the input signal to a signal having a lower resolution than that of the input signal if the region determination section determines that the input power to the amplifier is in the non-linear region of the amplifier.

17 Claims, 26 Drawing Sheets

| | INPUT ORTHOGONAL DATA | CORRECTED ORTHOGONAL DATA |
|---|---|---|
| AMPLITUDE | b | b 1 |
| PHASE | θ | θ + θ 1 |

F I G. 1 8
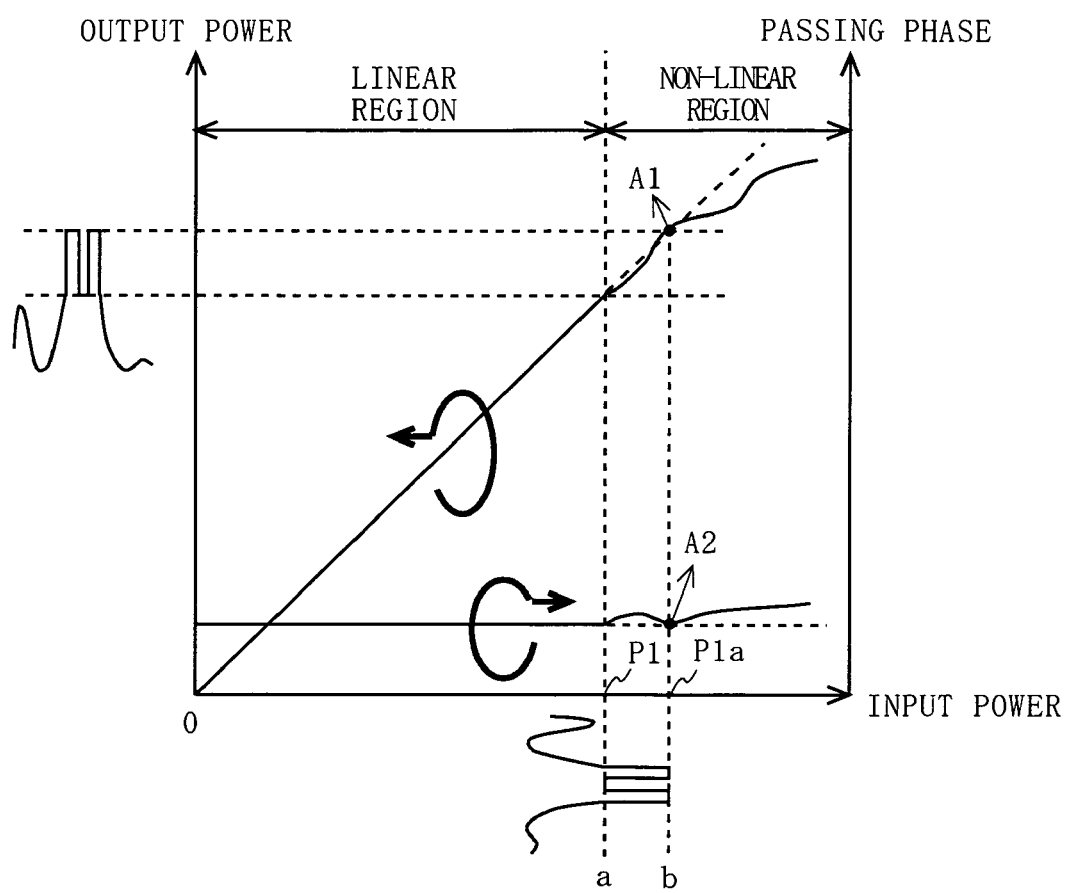

F I G. 2 7 A
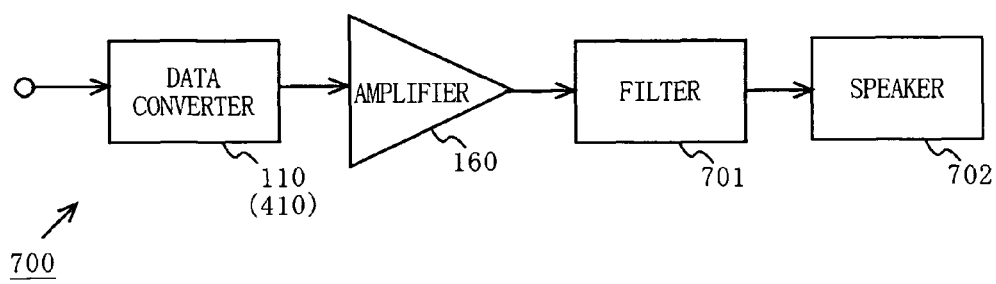
F I G. 2 7 B
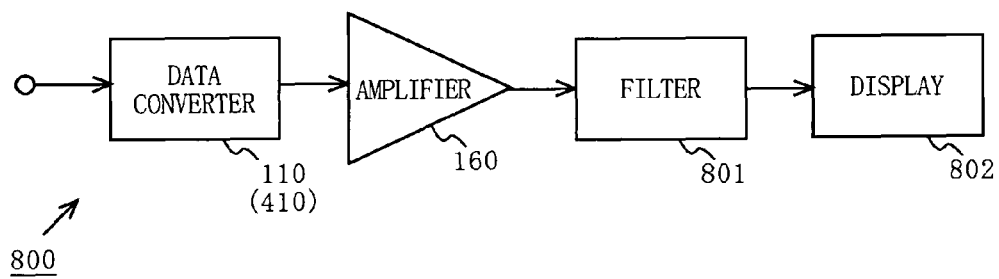

DATA CONVERTER AND DATA CONVERSION METHOD, AND TRANSMITTER CIRCUIT, COMMUNICATIONS DEVICE AND ELECTRONIC DEVICE USING THE SAME

BACKGROUND OF THE INVENTION

1. Field of the Invention

The present invention relates to a transmitter circuit in a communications device such as a mobile telephone or a wireless LAN device and an electronic device such as an audio device or a video device, and to a data converter and a data conversion method for use therein. More particularly, the present invention relates to a transmitter circuit, a communications device and an electronic device in which quantization noise can be suppressed, and to a data converter and a data conversion method for use therein.

2. Description of the Background Art

FIG. 28 is a block diagram showing a configuration of a conventional communications device 900. Referring to FIG. 28, the conventional communications device 900 includes a transmitter circuit 901, a receiver circuit 902, an antenna duplexer 903 and an antenna 904. A high-frequency signal to be transmitted is produced at the transmitter circuit 901, and is radiated into the air from the antenna 904 via the antenna duplexer 903. A high-frequency signal received by the antenna 904 is passed to the receiver circuit 902 via the antenna duplexer 903, and the received signal is processed. The antenna duplexer 903 may be a duplexer using, for example, a switch, a dielectric, a SAW (Surface Acoustic Wave) filter, an FBAR (Film Bulk Acoustic Resonator) filter, etc.

FIG. 29 is a block diagram showing an exemplary configuration of the transmitter circuit 901 in the conventional communications device 900 shown in FIG. 28. FIG. 29 schematically shows signal waveforms at different positions in the transmitter circuit 901. The transmitter circuit 901 is a type of a transmitter circuit that produces a signal to be transmitted through polar modulation. Referring to FIG. 29, the conventional transmitter circuit 901 includes a data production section 910, an angle modulator 920 and an amplitude modulator 930.

The data production section 910 converts a baseband signal of a rectangular coordinate system represented by I data (in-phase data) and Q data (quadrature-phase data) orthogonal to each other to a signal of a polar coordinate system, and outputs amplitude data and phase data. The amplitude data is inputted to the amplitude modulator 930. The phase data is inputted to the angle modulator 920.

The angle modulator 920 angle-modulates the received phase data to output a carrier wave. The carrier wave is inputted to the amplitude modulator 930.

The amplitude modulator 930 amplitude-modulates the carrier wave from the angle modulator 920 with the amplitude data from the data production section 910 to output the modulated signal. Thus, a signal to be transmitted is obtained. This type of modulation is called "polar modulation".

FIG. 30 is a block diagram showing a configuration of the amplitude modulator 930. Referring to FIG. 30, the amplitude modulator 930 includes matching circuits 931 and 936, a transistor 932, a DC power supply 933 and bias circuits 934 and 935.

The angle-modulated wave from the angle modulator 920 is received via the matching circuit 931, amplified through the transistor 932, and outputted via the matching circuit 936. The matching circuits 931 and 936 are circuits for the matching between the input and the output of the transistor 932. The bias circuits 934 and 935 are circuits for supplying bias voltages to the base or gate and the collector or drain, respectively, of the transistor 932. A DC voltage is supplied from the DC power supply 933 to the base terminal of the transistor 932 via the bias circuit 934. The gain of the transistor 932 varies depending on the voltage supplied from the data production section 910. Thus, the amplitude modulation is realized by supplying to the transistor 932 a voltage in proportion to the amplitude data from the data production section 910.

However, with the transmitter circuit 901 shown in FIG. 29, the output signal may be distorted when, for example, the input power to the transistor 932 becomes high or low. FIG. 31 is an exemplary schematic diagram illustrating the cause of the distortion.

In FIG. 31, the horizontal axis represents the level of the input power to the transistor 932, i.e., the level of the amplitude data. The left vertical axis represents the level of the output power from the transistor 932. The right vertical axis represents the phase of the signal passing through the transistor 932 (hereinafter referred to as the "passing phase").

In FIG. 31 showing the output power and the passing phase together in a single graph, elliptical markings with arrow heads are used to indicate which curve belongs to which vertical axis.

In an ideal transistor, the input power and the output power are proportional to each other. Moreover, in an ideal transistor, the passing phase is kept constant as the input power increases. In FIG. 31, such characteristics of an ideal transistor are represented by dotted lines on the high input power side. Thus, with an ideal transistor, the output power and the passing phase vary linearly across the entire input power range.

However, transistors in practice may not have linear characteristics across the entire input power range. As shown in FIG. 31, for input power levels greater than P, the output power and the input power are not proportional to each other and the passing phase does not stay constant. In other words, for input power levels greater than P, the transistor does not have linear characteristics.

If amplitude data is inputted in such a non-linear region, the output power is amplified non-proportionally and the phase is shifted. Thus, if amplitude data is inputted in the non-linear region, the output signal is distorted. In other words, as the output of the transmitter circuit increases, the output signal will be distorted.

In order to solve the problem, conventional methods discretize the amplitude data. FIG. 32 is a block diagram showing an alternative configuration of a transmitter circuit in the conventional communications device 900 of FIG. 28 (see FIG. 1 of Japanese Laid-Open Patent Publication No. 2002-325109). Referring to FIG. 32, a transmitter circuit 901a includes the data production section 910, the angle modulator 920, the amplitude modulator 930, a band-pass filter 940 and a delta-sigma modulator 950. In FIG. 32, like components to those shown in FIG. 29 are denoted by like reference numerals. FIG. 32 schematically shows signal waveforms at different positions.

In the transmitter circuit 901a, the amplitude data from the data production section 910 is delta-sigma-modulated through the delta-sigma modulator 950 so as to be discretized into a binary signal (typically using two values of zero and a positive real number), which is inputted to the amplitude modulator 930.

The phase data from the data production section 910 is inputted to the angle modulator 920, where the phase data is angle-modulated into an angle-modulated wave, which is inputted to the amplitude modulator 930.

The amplitude modulator 930 amplitude-modulates the carrier wave from the angle modulator 920 with the output signal from the delta-sigma modulator 950. The configuration of the amplitude modulator 930 is as shown in FIG. 30. Therefore, a voltage signal corresponding to the binary signal from the delta-sigma modulator 950 is supplied to the transistor 932, whereby the carrier wave is turned ON/OFF by the binary signal, thus realizing amplitude modulation.

The band-pass filter 940 outputs the signal to be transmitted while removing quantization noise introduced by the delta-sigma modulation.

As described above, the transmitter circuit 901*a* performs amplitude modulation using a delta-sigma-modulated binary signal. Therefore, the output signal of the amplitude modulator 930 is obtained simply by turning ON/OFF an angle-modulated wave. Thus, the output signal from the transmitter circuit 901*a* will not be distorted.

However, the transmitter circuit 901*a* shown in FIG. 32 has a problem in that the output signal contains considerable quantization noise. FIG. 33 shows the spectrum of an output signal from the amplitude modulator 930 of the transmitter circuit 901*a* shown in FIG. 32. FIG. 34 shows the spectrum of an output signal from the band-pass filter 940 of the transmitter circuit 901*a* shown in FIG. 32. Note that the zero frequency point along the horizontal axis represents the center frequency.

As shown in FIG. 33, the output from the amplitude modulator 930 contains considerable quantization noise. Therefore, the quantization noise needs to be removed through the band-pass filter 940. However, removing the quantization noise results in a loss of signal. Where the quantization noise energy accounts for 30% to 40% of the total energy, for example, the overall efficiency of the transmitter circuit 901*a* will be as low as 60% to 70% even if the efficiency of the amplitude modulator 930 is 100%. Therefore, the overall power consumption of the transmitter circuit cannot be reduced unless the power of the quantization noise is reduced. In other words, the higher the power of the quantization noise is, the higher the overall power consumption of the transmitter circuit is.

Moreover, a large amount of suppression is required at the band-pass filter 940 in order to sufficiently remove the unnecessary quantization noise. To do so, the filtering loss through the band-pass filter 940 increases. In order to realize a large amount of suppression, the size of the band-pass filter 940 increases, thus increasing the overall circuit scale of the transmitter circuit.

Moreover, as shown in FIG. 34, quantization noise near the intended wave frequency cannot be removed by a band-pass filter. In order to remove the quantization noise near the intended wave frequency, the delta-sigma modulator 950 needs to output a signal that is sufficiently low in noise. In order to realize this, the level of the quantization noise near the intended wave frequency needs to be reduced by increasing the clock frequency of the delta-sigma modulator 950. This however increases the power consumption at the delta-sigma modulator 950.

SUMMARY OF THE INVENTION

Therefore, an object of the present invention is to provide a transmitter circuit, a communications device and an electronic device in which the quantization noise is suppressed and the power consumption is reduced, and to provide a data converter and a data conversion method for use therein.

The present invention has the following features to attain the object mentioned above. A first aspect of the present invention is directed to a data converter for converting an input signal to a signal to be inputted to an amplifier, the data converter including: an amplitude detection section for detecting an amplitude level of the input signal; a region determination section for determining whether or not an input power to the amplifier is in a non-linear region of the amplifier based on the amplitude level of the input signal detected by the amplitude detection section; and a signal processing section for converting the input signal to a signal having a lower resolution than that of the input signal if the region determination section determines that the input power to the amplifier is in the non-linear region of the amplifier.

In a preferred embodiment, where the input signal is discretized, the signal processing section converts the input signal to a signal having a lower resolution than that of the input signal by increasing an interval between discrete values.

In a preferred embodiment, where the input signal is not discretized, the signal processing section converts the input signal to a signal having a lower resolution than that of the input signal by discretizing the input signal.

In a preferred embodiment, if the region determination section determines that the input power to the amplifier is not in the non-linear region of the amplifier, the signal processing section discretizes the input signal so that an interval between discrete values is narrower than that in a case where it is determined that the input power to the amplifier is in the non-linear region.

In a preferred embodiment, where the input signal is orthogonal data, the amplitude detection section detects the amplitude level of the input signal by obtaining a square root of a sum of squares of the orthogonal data.

In a preferred embodiment, the data converter further includes a correction section for correcting the signal, which has been converted by the signal processing section, so that distortion occurring at the amplifier is suppressed.

In a preferred embodiment, the correction section corrects an amplitude and a phase of the input signal.

In a preferred embodiment, the correction section generates a signal having an equal amplitude and an opposite phase to those of a distortion component occurring at the amplifier.

In a preferred embodiment, the region determination section determines that an input voltage to the amplifier is in the non-linear region if the amplitude level of the input signal exceeds a first threshold value.

In a preferred embodiment, the region determination section determines that an input voltage to the amplifier is in the non-linear region if the amplitude level of the input signal does not exceed a second threshold value.

In a preferred embodiment, the region determination section determines that an input voltage to the amplifier is in the non-linear region if the amplitude level of the input signal does not exceed a third threshold value or if the amplitude level of the input signal exceeds a fourth threshold value.

In a preferred embodiment, the signal processing section converts the input signal to a signal having a lower resolution than that of the input signal by delta-sigma modulation.

In a preferred embodiment, a signal, which has been amplified through a variable-gain amplifier, is inputted to the amplifier; the region determination section determines whether or not an input voltage to the amplifier is in the non-linear region of the amplifier based on whether or not the amplitude level of the input signal is outside a predetermined range; and the data converter further includes a predetermined range adjustment section for adjusting the predetermined range based on information indicating a gain of the variable-gain amplifier.

In a preferred embodiment, the signal processing section includes: a coordinate system conversion section for converting the input signal to amplitude data and phase data; a delta-sigma modulator for delta-sigma-modulating the amplitude data, which has been obtained through conversion by the coordinate system conversion section; and a multiplier for multiplying the phase data by the delta-sigma-modulated amplitude data from the delta-sigma modulator.

In a preferred embodiment, the input signal is orthogonal data; the signal processing section includes: a subtractor receiving the input signal; a vector integrator connected to the subtractor for integrating together elements of the orthogonal data; and a vector quantizer for quantizing the orthogonal data, which has been integrated by the vector integrator, so that a magnitude of a vector formed by the integrated orthogonal data is equal to a maximum discrete value among at least two discrete values that is smaller than a magnitude of a vector formed by the input orthogonal data and so that a phase of the integrated orthogonal data is equal to that of the input orthogonal data; and the subtractor subtracts the orthogonal data, which has been obtained through quantization by the vector quantizer, from the input orthogonal data.

A second aspect of the present invention is directed to a transmitter circuit for generating a signal to be transmitted, the transmitter circuit including: an amplifier; and a data converter for converting an input signal to a signal to be inputted to the amplifier; wherein the data converter includes: an amplitude detection section for detecting an amplitude level of the input signal; a region determination section for determining whether or not an input power to the amplifier is in a non-linear region of the amplifier based on the amplitude level of the input signal detected by the amplitude detection section; and a signal processing section for converting the input signal to a signal having a lower resolution than that of the input signal if the region determination section determines that the input power to the amplifier is in the non-linear region of the amplifier.

In a preferred embodiment, the transmitter circuit further includes a correction section for correcting the signal, which has been converted by the signal processing section, so that distortion occurring at the amplifier is suppressed.

In a preferred embodiment, the transmitter circuit further includes a filter connected at a position subsequent to the amplifier.

In a preferred embodiment, the transmitter circuit further includes a variable-gain-amplifier for adjusting a power of the signal inputted to the amplifier, wherein: the region determination section determines whether or not the input power to the amplifier is in the non-linear region based on whether or not the amplitude level of the input signal is outside a predetermined range; and the data converter further includes a predetermined range adjustment section for adjusting the predetermined range based on information indicating a gain of the variable-gain amplifier.

In a preferred embodiment, the input signal to the data converter is orthogonal data; the data converter outputs converted orthogonal data; the transmitter circuit further includes a vector modulator for modulating the converted orthogonal data from the data converter; and the amplitude detection section detects the amplitude level of the input signal based on the orthogonal data.

In a preferred embodiment, the input signal to the data converter is orthogonal data; the data converter outputs converted orthogonal data; the transmitter circuit further includes a coordinate system conversion section for converting the converted orthogonal data to data of a polar coordinate system so as to produce amplitude data and phase data; the transmitter circuit further includes an angle modulator for angle-modulating the phase data produced by the coordinate system conversion section; the amplifier is an amplitude modulator for amplitude-modulating the phase data, which has been angle-modulated by the angle modulator, based on the amplitude data produced by the coordinate system conversion section; and the amplitude detection section detects the amplitude level of the input signal based on the orthogonal data.

In a preferred embodiment, the transmitter circuit further includes: a data production section for producing amplitude data and phase data; and an angle modulator for angle-modulating the phase data produced by the data production section so as to produce an angle-modulated wave, wherein: the input signal to the data converter is the amplitude data produced by the data production section; the data converter outputs converted amplitude data; the amplitude detection section detects the amplitude level of the input signal based on the amplitude data; the amplifier is an amplitude modulator for amplitude-modulating the phase data, which has been angle-modulated by the angle modulator, based on the converted amplitude data from the data converter; and the amplitude detection section detects the amplitude level of the input signal based on a level of the amplitude data.

A third aspect of the present invention is directed to a communications device, including: a transmitter circuit for producing a signal to be transmitted; and a receiver circuit for processing a received signal, the transmitter circuit including: an amplifier; and a data converter for converting an input signal to a signal to be inputted to the amplifier, the data converter including: an amplitude detection section for detecting an amplitude level of the input signal; a region determination section for determining whether or not an input power to the amplifier is in a non-linear region of the amplifier based on the amplitude level of the input signal detected by the amplitude detection section; and a signal processing section for converting the input signal to a signal having a lower resolution than that of the input signal if the region determination section determines that the input power to the amplifier is in the non-linear region of the amplifier.

A fourth aspect of the present invention is directed to an electronic device, including: an amplifier; and a data converter for converting an input signal to a signal to be inputted to the amplifier, the data converter including: an amplitude detection section for detecting an amplitude level of the input signal; a region determination section for determining whether or not an input power to the amplifier is in a non-linear region of the amplifier based on the amplitude level of the input signal detected by the amplitude detection section; and a signal processing section for converting the input signal to a signal having a lower resolution than that of the input signal if the region determination section determines that the input power to the amplifier is in the non-linear region of the amplifier.

A fifth aspect of the present invention is directed to a method for processing a signal in a data converter for converting an input signal to a signal to be inputted to the amplifier, the method including: a step of detecting an amplitude level of the input signal; a step of determining whether or not an input power to the amplifier is in a non-linear region of the amplifier based on the detected amplitude level of the input signal; and a step of converting the input signal to a signal having a lower resolution than that of the input signal if it is determined that the input power to the amplifier is in the non-linear region of the amplifier.

In a preferred embodiment, the determination of whether or not the input power to the amplifier is in the non-linear region of the amplifier is made based on whether or not the amplitude level of the input signal is outside a predetermined range; and the method further includes a step of adjusting the predetermined range based on information indicating a gain of a variable-gain amplifier connected at a position preceding the amplifier.

Effects of the present invention will now be described. In the present invention, the amplitude level of the input signal is detected, and it is determined whether or not the input power to the amplifier is in the non-linear region of the amplifier based on the detected amplitude level of the input signal. If the input power is in the non-linear region, the input signal is outputted after the resolution thereof is lowered. Therefore, only portions of the input signal that have power levels in the non-linear region of the amplifier are discretized. Since only part of the input signal is discretized, the quantization noise is reduced as compared with a case where the whole of the input signal is discretized, as is the case in the prior art.

As the quantization noise is reduced, the amplifier no longer amplifies unnecessary signal portions, whereby it is possible to reduce the overall power consumption of the transmitter circuit.

Moreover, the correction section corrects the power and the phase of the discretized input signal and those of the output signal corresponding to the discretized input signal, whereby no distortion occurs in the amplifier.

Moreover, the quantization noise is suppressed across the entire range, including the quantization noise near the intended wave frequency. Therefore, the level of damping characteristics required for the band-pass filter in the transmitter circuit is lowered, thereby reducing the filtering loss. Furthermore, it is no longer necessary to use a sharp band-pass filter, whereby it is possible to reduce the power consumption of the transmitter circuit. As a result, the overall size of the transmitter circuit can also be reduced.

Moreover, in the present embodiment, the amplitude resolution is small, whereby the table size is considerably smaller than those in a case where a correction table is provided in a conventional transmitter circuit that does not convert data through a delta-sigma modulator.

It is typical in the art that the clock frequency for the discretization in the data converter is increased to reduce the quantization noise near the intended wave frequency. In the present invention, however, it is not necessary to increase the clock frequency at the data converter because the quantization noise is already reduced, whereby it is possible to reduce the power consumption of the data converter.

Where the input signal is discretized, the signal processing section can simply increase the interval between discrete values to obtain a signal having a lower resolution than that of the input signal. Thus, the process is simple.

Where the input signal is not discretized, the signal processing section can discretize the input signal to obtain a signal having a lower resolution than that of the input signal. Thus, a signal having a lower resolution than that of the input signal can be obtained simply by using a common discretization method such as delta-sigma modulation.

If the region determination section determines that the input power to the amplifier is not in the non-linear region of the amplifier, the signal processing section can discretize the input signal so that the interval between discrete values is narrower than that in a case where it is determined that the input power to the amplifier is in the non-linear region, thereby obtaining a signal having a lower resolution than that of the input signal.

Where the input signal is orthogonal data, the amplitude detection section detects the amplitude level of the input signal by obtaining the square root of the sum of squares of the orthogonal data, whereby it is possible to easily detect the amplitude level of the input signal.

Using any one or more of the first to fourth threshold values, the region determination section can easily determine whether or not the input power to the amplifier is in the non-linear region.

The predetermined range adjustment section adjusts the predetermined range based on information indicating the gain of the variable-gain amplifier, whereby the determination of whether or not an input signal is to be converted to a signal having a lower resolution is made according to the power that is actually inputted to the amplifier.

By using a delta-sigma modulator or a vector quantizer in the signal processing section, it is possible to reduce the resolution of part of the input signal.

A transmitter circuit, a communications device and an electronic device using the data converter of the present invention are capable of suppressing the quantization noise while reducing the power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 18 shows the characteristics of an amplifier 260 and an operation of the transmitter circuit 200;

FIG. 27A is a block diagram showing a functional configuration of an audio device 700 using a data converter of the present invention;

FIG. 27B is a block diagram showing a functional configuration of a video device 800 using a data converter of the present invention;

DESCRIPTION OF THE PREFERRED EMBODIMENTS

Figure 28:
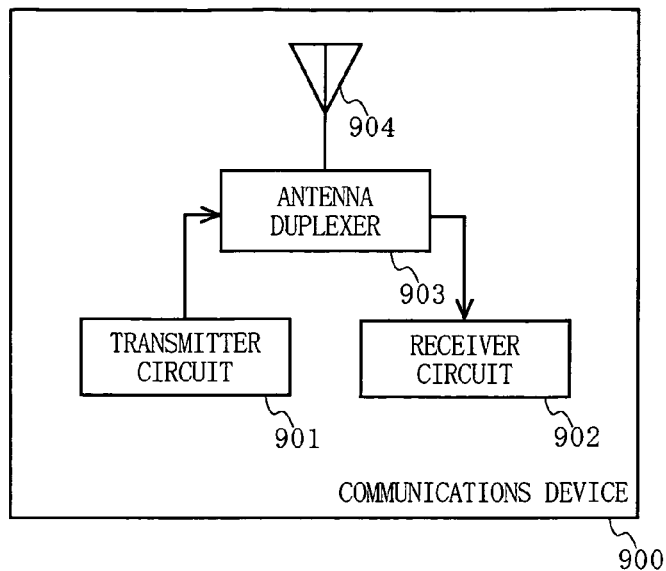
FIG. 28 is a block diagram showing a configuration of a conventional communications device 900.
Figure 29:
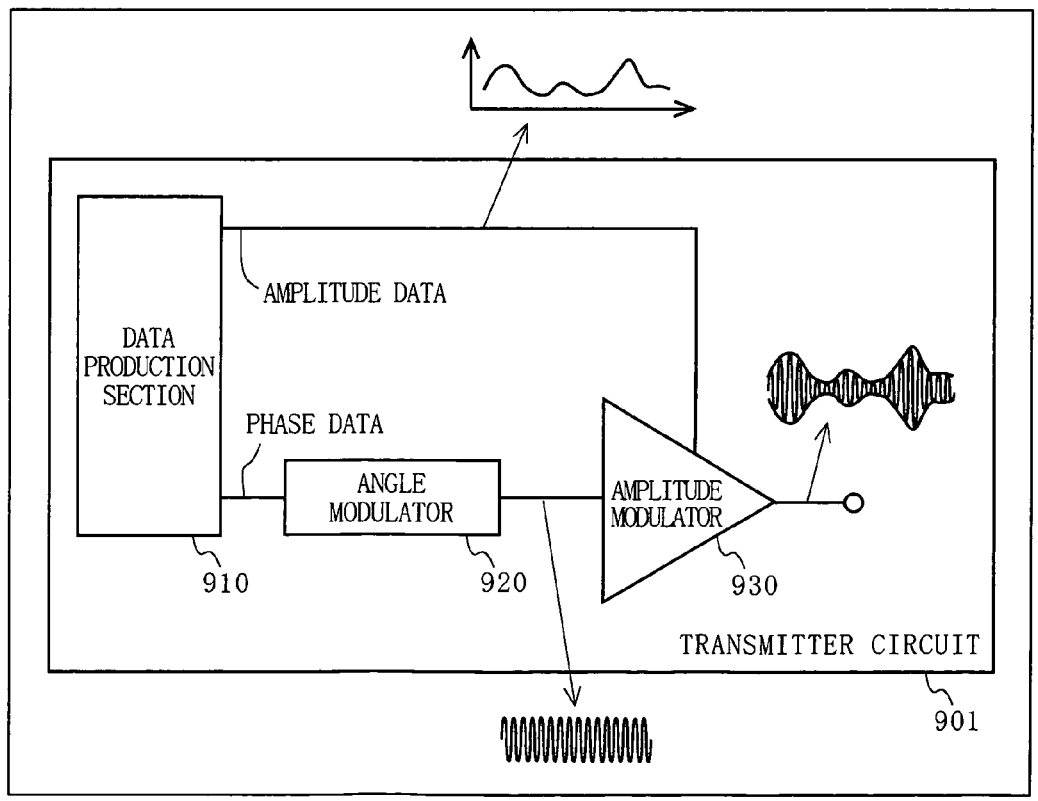
FIG. 29 is a block diagram showing an exemplary configuration of a transmitter circuit 901 in the conventional communications device 900 shown in FIG. 28.
Figure 30:
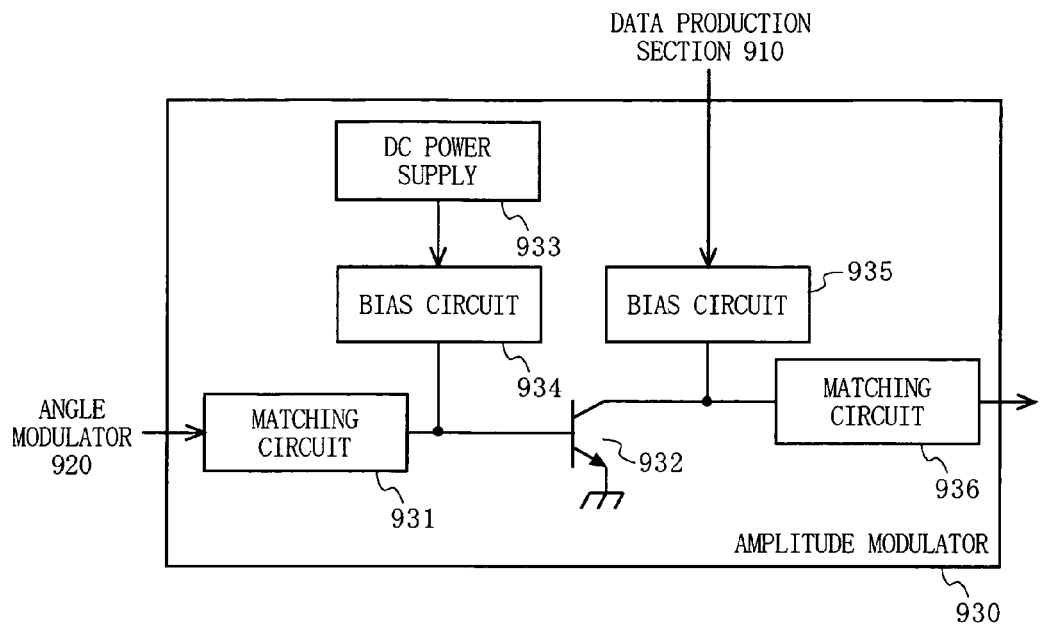
FIG. 30 is a block diagram showing a configuration of an amplitude modulator 930.
Figure 31:
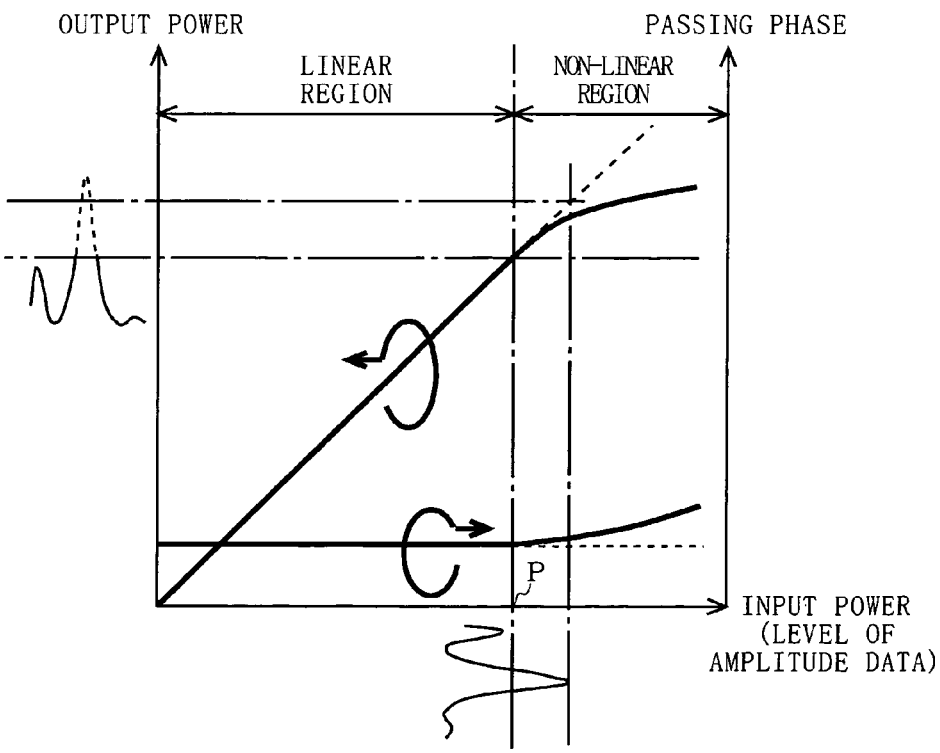
FIG. 31 is a schematic diagram illustrating the cause of the distortion.
Figure 32:
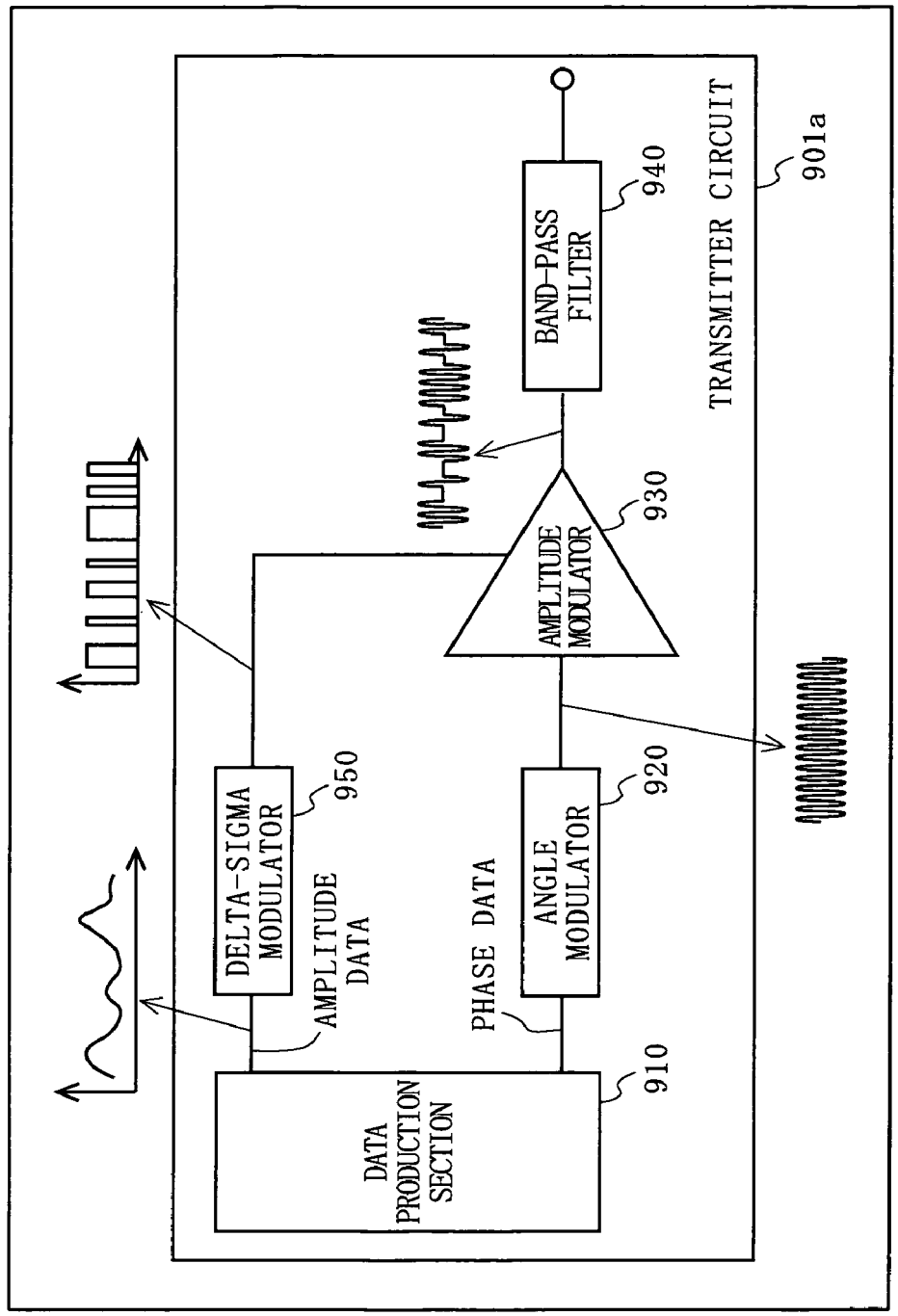
FIG. 32 is a block diagram showing another exemplary configuration of a transmitter circuit in the conventional communications device 900 shown in FIG. 28.
Figure 33:
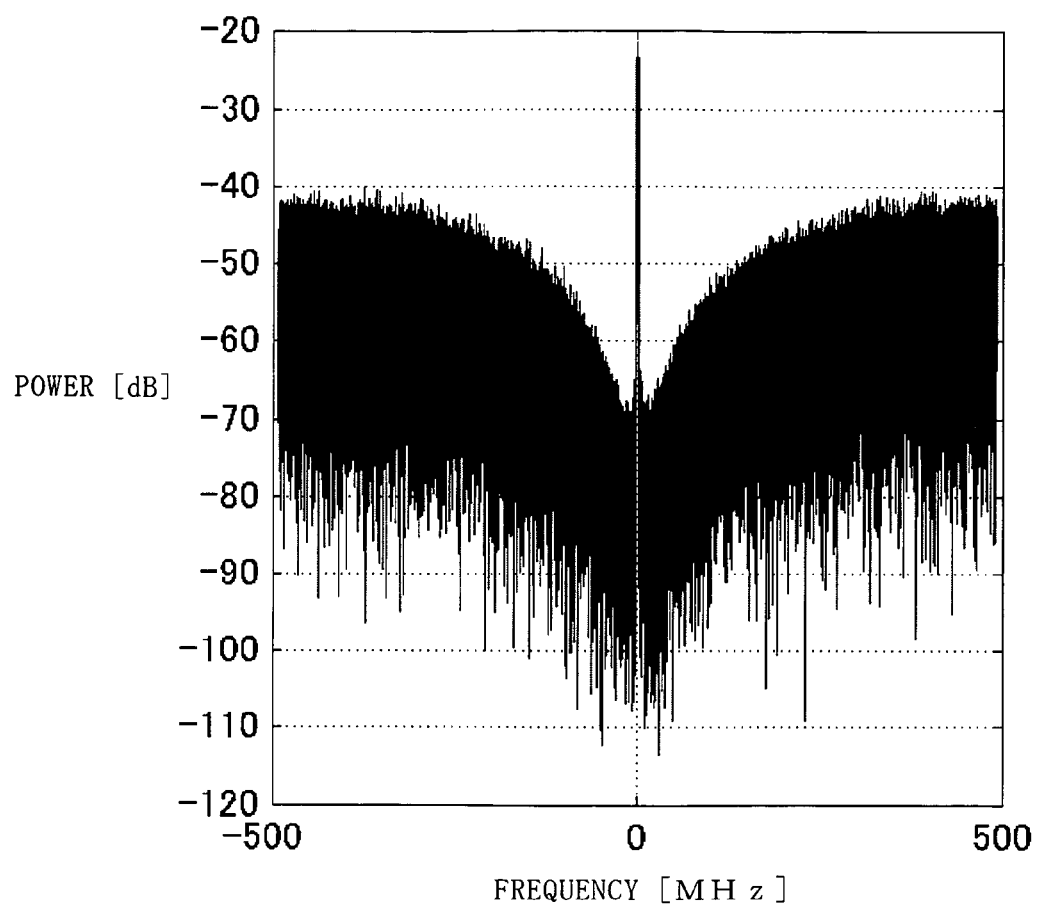
FIG. 33 shows a spectrum of an output signal from the amplitude modulator 930 of a transmitter circuit 901a shown in FIG. 32.
Figure 34:
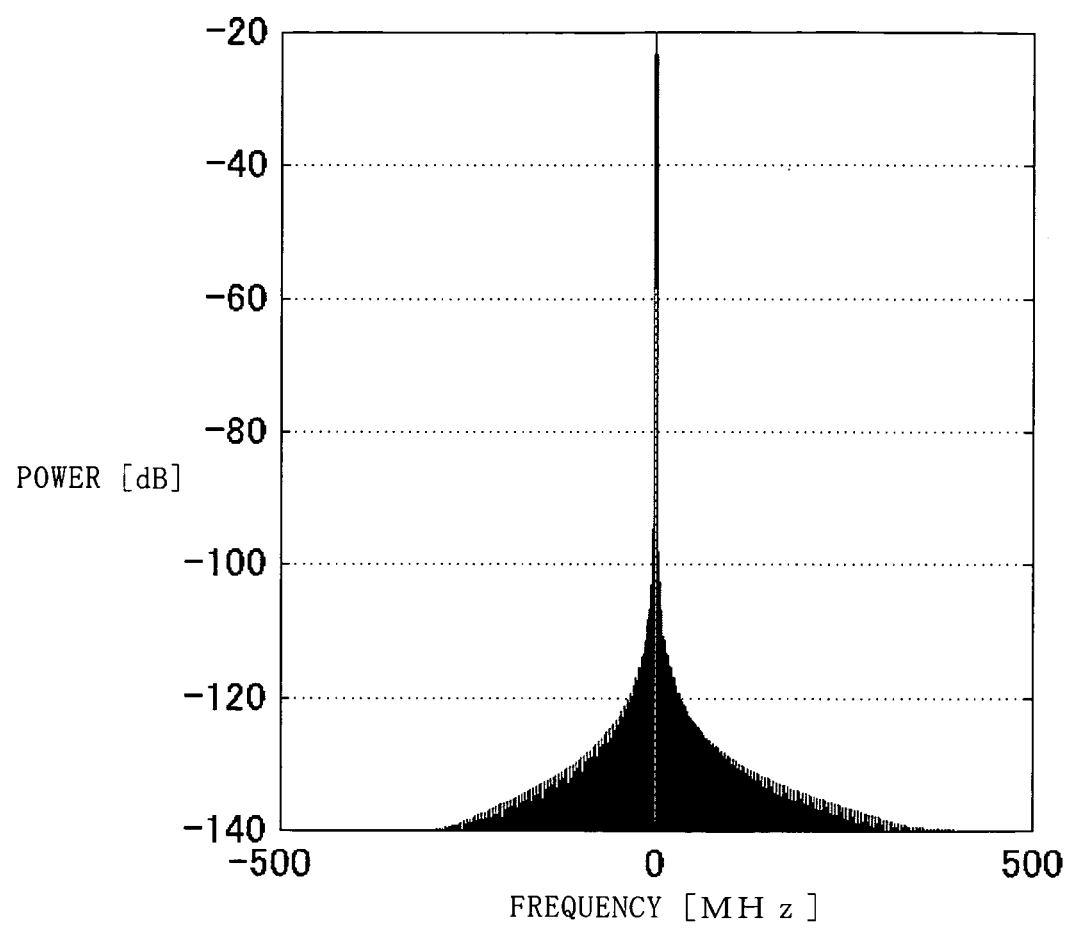
FIG. 34 shows a spectrum of an output signal from a band-pass filter 940 of the transmitter circuit 901a shown in FIG. 32.

Preferred embodiments of the present invention will now be described with reference to the drawings. In the preferred embodiments to follow, a communications device using a transmitter circuit of the present invention will be illustrated, and the communications device per se is as described above in the background art section. Therefore, FIG. 28 is relied upon in the following embodiments. The following embodiments are primarily directed to the data converter of the present invention being used in a communications device. However, the application of the data converter of the present invention is not limited to communications devices, but can be used in any electronic devices using amplifiers, such as audio devices and video devices.

First Embodiment

Figure 1:
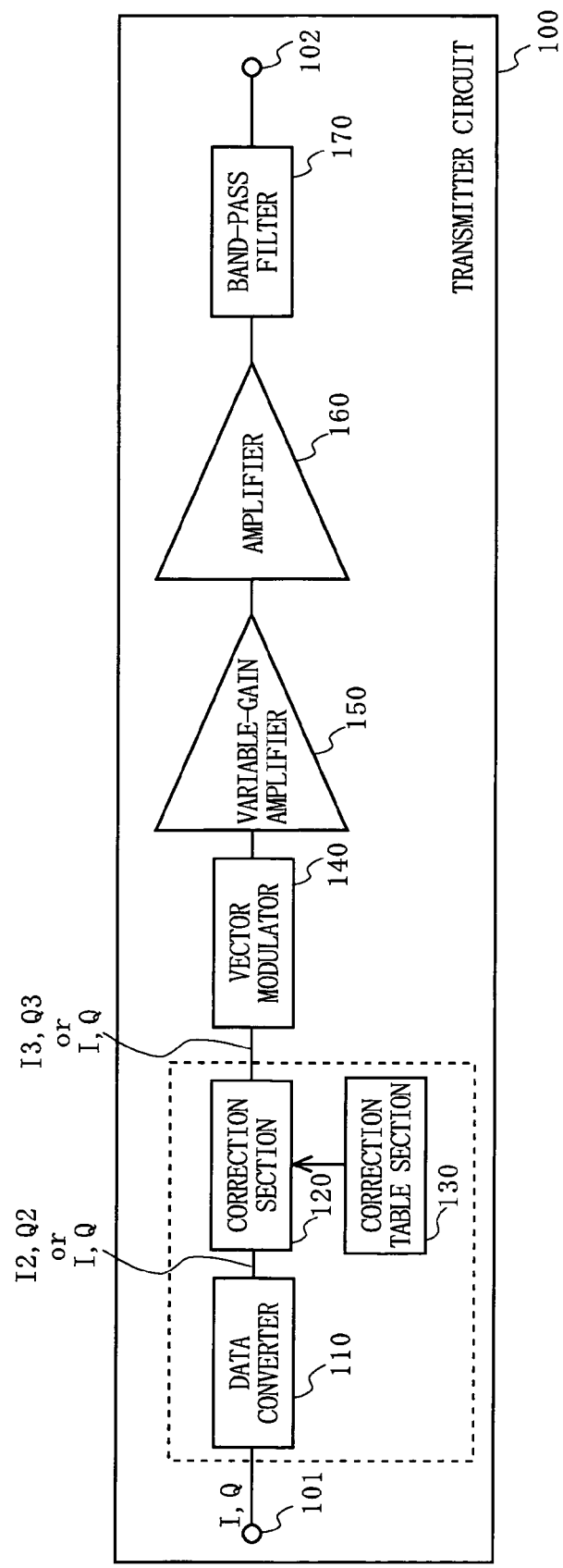
FIG. 1 is a block diagram showing a configuration of a transmitter circuit 100 according to the first embodiment of the present invention.

FIG. 1 is a block diagram showing a configuration of a transmitter circuit 100 according to the first embodiment of the present invention. Referring to FIG. 1, the transmitter circuit 100 includes an input terminal 101, a data converter 110, a correction section 120, a correction table section 130, a vector modulator 140, a variable-gain amplifier 150, an amplifier 160, a band-pass filter 170 and an output terminal 102.

The transmitter circuit 100 receives I data and Q data, being orthogonal to each other, from a data production section (not shown). The transmitter circuit 100 converts the received I and Q data to a high-frequency signal to be transmitted.

The data production section (not shown) is connected to one end of the input terminal 101. The data converter 110 is connected to the other end of the input terminal 101. The correction section 120 is connected to the output side of the data converter 110. The correction table section 130 is connected to the correction section 120. The vector modulator 140 is connected to the output side of the correction section 120. The variable-gain amplifier 150 is connected to the output side of the vector modulator 140. The amplifier 160 is connected to the output side of the variable-gain amplifier 150. The band-pass filter 170 is connected to the output side of the amplifier 160. The output terminal 102 is connected to the output side of the band-pass filter 170.

The data converter 110 converts the input signal received via the input terminal 101 to a signal to be inputted to the amplifier 160. The correction section 120 corrects the data values (the amplitude value and the phase value) of the signal outputted from the data converter 110. The correction table section 130 is a storage section for storing a correction table, which is referred to when a correction operation is performed at the correction section 120. The data converter 110, the correction section 120 and the correction table section 130 may be called collectively as a "data converter" as they together function to convert the input signal to a signal to be inputted to the amplifier 160.

The vector modulator 140 modulates the orthogonal data onto the carrier wave. The variable-gain amplifier 150 adjusts the power to be inputted to the amplifier 160 with the gain variable according to an instruction from an external control section (not shown). The amplifier 160 includes a transistor and amplifies the input signal. The band-pass filter 170 is a filter that allows only signal components within an intended frequency band to pass therethrough.

The operation of the transmitter circuit 100 will now be described.

The input signal to the data converter 110 is orthogonal data expressed as I data and Q data. Based on the I and Q data inputted to the input terminal 101, the data converter 110 detects $(I^2+Q^2)^{1/2}$, which is the amplitude level of the orthogonal data being the input signal. The data converter 110 determines whether or not the detected amplitude level $(I^2+Q^2)^{1/2}$ is within a predetermined range. The data converter 110 varies the predetermined range based on the level of the power that the amplifier 160 is supposed to output, which is notified by an external control section (not shown).

If the amplitude level is within the predetermined range, the data converter 110 outputs the I and Q data as they are. If not, the data converter 110 outputs I2 data and Q2 data, which are obtained by lowering the resolution of the magnitude of the vector formed by the inputted I and Q data. Note that the term "level/magnitude of orthogonal data" as used herein refers to the magnitude of the vector formed by the orthogonal data. Specifically, if the amplitude level is not within the predetermined range and if the orthogonal data is previously discretized, the data converter 110 lowers the resolution by increasing the interval between discrete values. If the amplitude level is not within the predetermined range and if the orthogonal data is not previously discretized, the data converter 110 lowers the resolution by discretizing the level of the input signal. Thus, if an input signal has an amplitude value outside the predetermined range, the data converter 110 converts the input signal to a signal having a lower resolution with respect to the amplitude level thereof.

The correction table of the correction table section 130 contains information for correcting the amplitude value and the phase value of the amplitude signal based on the I2 and Q2 data.

If the correction section 120 receives I2 and Q2 data from the data converter 110, the correction section 120 refers to the correction table stored in the correction table section 130 so as to correct the amplitude value and the phase value, which are obtained based on the I2 and Q2 data, to obtain I3 and Q3 data. If the correction section 120 receives I and Q data from the data converter 110, the correction section 120 outputs the I and Q data as they are.

The vector modulator 140 combines together the received orthogonal data and a carrier wave by modulating the orthogonal data onto the carrier wave.

For example, the vector modulator 140 is a quadrature modulator. In such a case, the vector modulator 140 converts the received I and Q data or I3 and Q3 data to I cos(ωt)−Q sin(ωt) or I3 cos(ωt)−Q3 sin(ωt). In these and subsequent expressions, I, Q, I3 and Q3 denote the values of I data, Q data, I3 data and Q3 data, respectively.

Alternatively, the vector modulator 140 may be a polar modulator, for example. In such a case, the vector modulator 140 converts the received I and Q data to $(I^2+Q^2)^{1/2}$ cos(ωt+φ), where φ is the angle of a vector formed by the I and Q data, and φ=tan$^{-1}$ (Q/I).

The variable-gain amplifier 150 varies its gain according to an instruction from an external control section (not shown). For example, where the output power of the amplifier 160 needs to be reduced to ½, the variable-gain amplifier 150 sets its gain to ½ so as to lower the power of the signal inputted to the amplifier 160 to reduce the output power of the amplifier 160 to ½. A typical case where the variable-gain amplifier 150 has its gain variable is where the communications device including the transmitter circuit 100 therein may be physically near or far away from other communications devices that it is communicating with. In such a case, the gain of the variable-gain amplifier 150 is increased or decreased so as to increase or decrease the power of the transmitted signal.

The amplifier 160 amplifies the modulated signal from the vector modulator 140.

The band-pass filter 170 filters the amplified signal from the amplifier 160 so as to remove out-of-band, unnecessary quantization noise components thereof.

Figure 2:
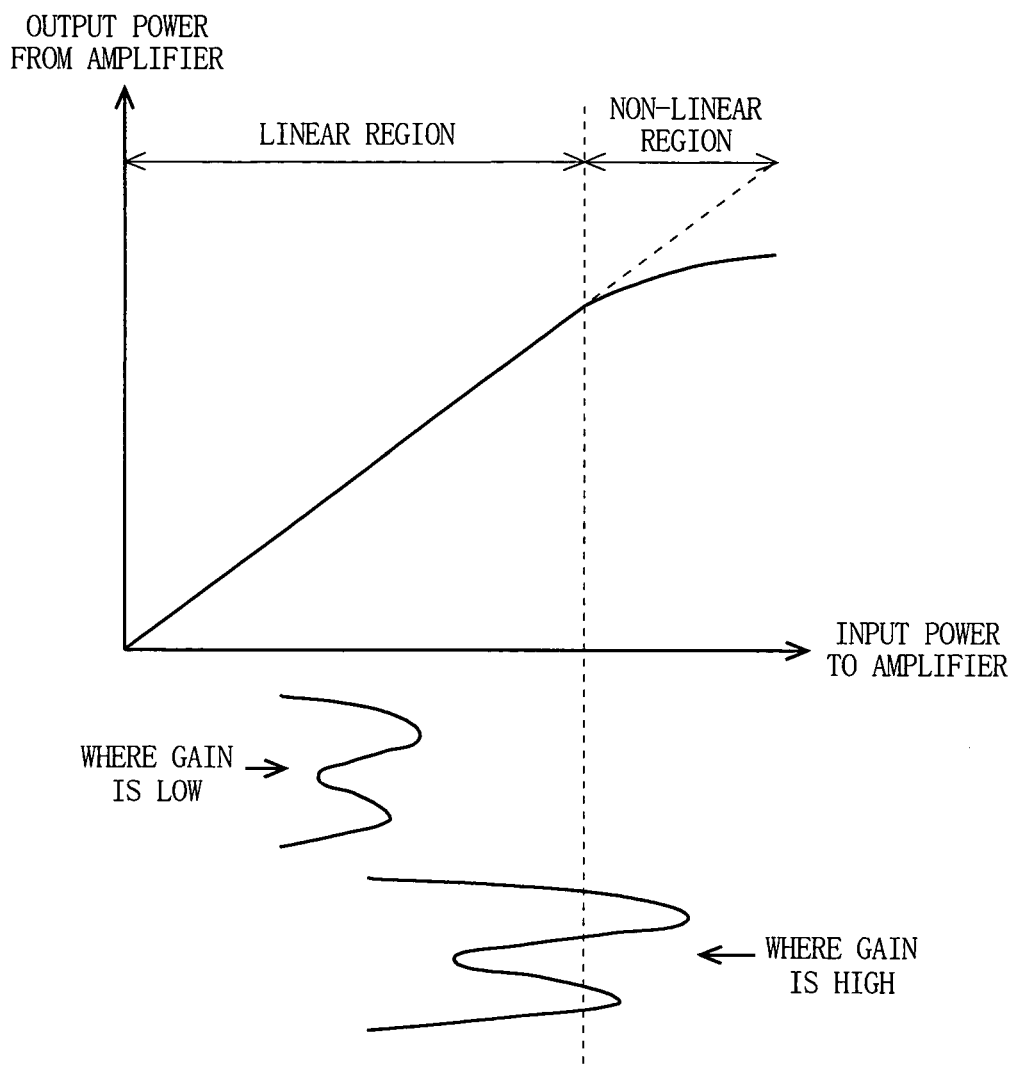
FIG. 2 is used to illustrate how to set a predetermined range in a data converter 110.

As described above, the predetermined range used in the data converter 110 is varied based on the level of the power that the amplifier 160 is supposed to output. FIG. 2 is used to illustrate how to set the predetermined range in the data converter 110. If the level of the power that the amplifier 160 is supposed to output is low, the gain at the variable-gain amplifier 150 may also be low. If the gain of the variable-gain amplifier 150 is low, the input power to the amplifier 160 is also low, in which case the input power will be in the linear region of the amplifier 160. In such a case, if the predetermined range is narrow, the resolution may be lowered even though the input power to the amplifier 160 is in the linear region. Therefore, the predetermined range should be wide in such a case. If the level of the power that the amplifier 160 is supposed to output is high, the gain at the variable-gain amplifier 150 should also be high. If the gain of the variable-gain amplifier 150 is high, the input power to the amplifier 160 is also high, in which case the input power will be in the non-linear region of the amplifier 160. In such a case, if the predetermined range is wide, the resolution is not lowered even though the input power to the amplifier 160 is in the non-linear region. Therefore, the predetermined range should be narrow in such a case. As described above, the data converter 110 varies the predetermined range according to the level of the power that the amplifier 160 is supposed to output, which is information indicating the gain of the variable-gain amplifier 150. Alternatively, the data converter 110 may adjust the predetermined range according to the gain of the variable-gain amplifier 150 itself as the information indicating the gain of the variable-gain amplifier 150. In either case, the data converter 110 (a predetermined range adjustment section 111c to be described later) adjusts the predetermined range based on the information indicating the gain of the variable-gain amplifier 150.

Figure 3:
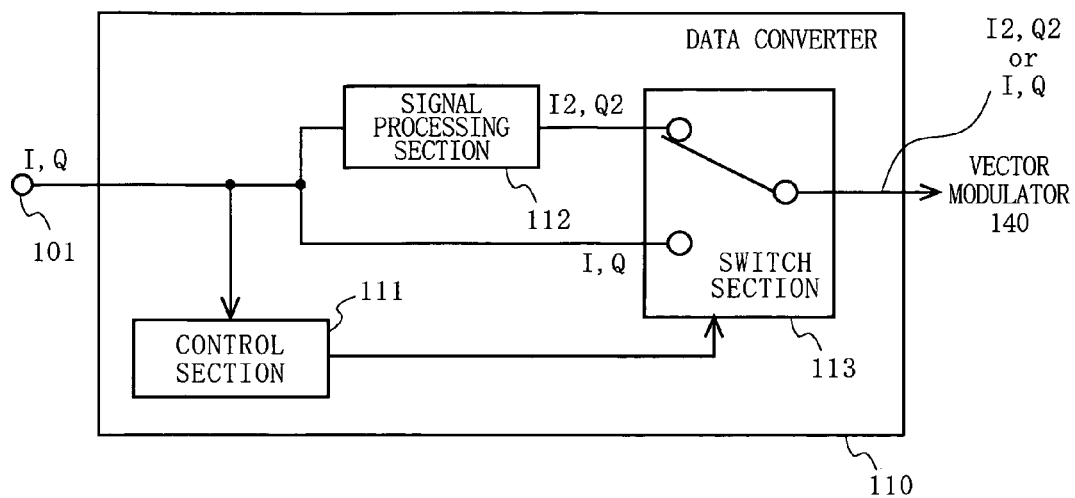
FIG. 3 is a block diagram showing an exemplary functional configuration of the data converter 110.

FIG. 3 is a block diagram showing an exemplary functional configuration of the data converter 110. Referring to FIG. 3, the data converter 110 includes a control section 111, a signal processing section 112 and a switch section 113.

Figure 4:
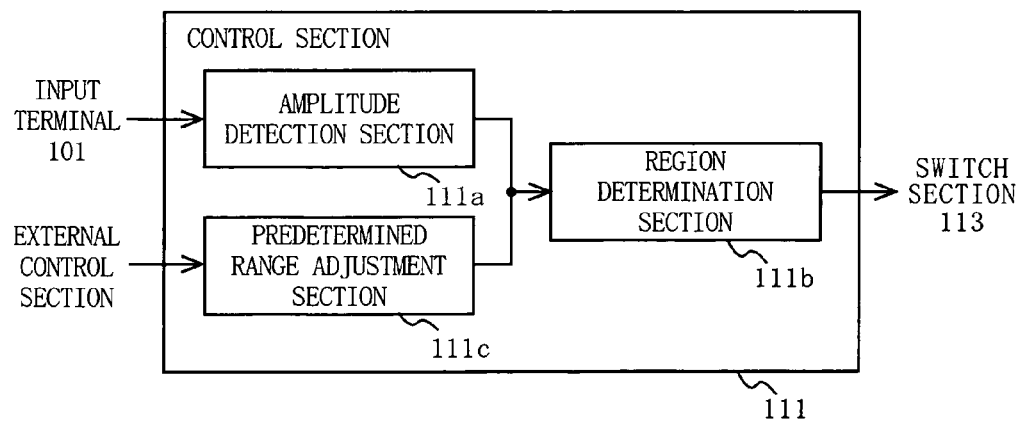
FIG. 4 is a block diagram showing a functional configuration of a control section 111.
Figure 5:
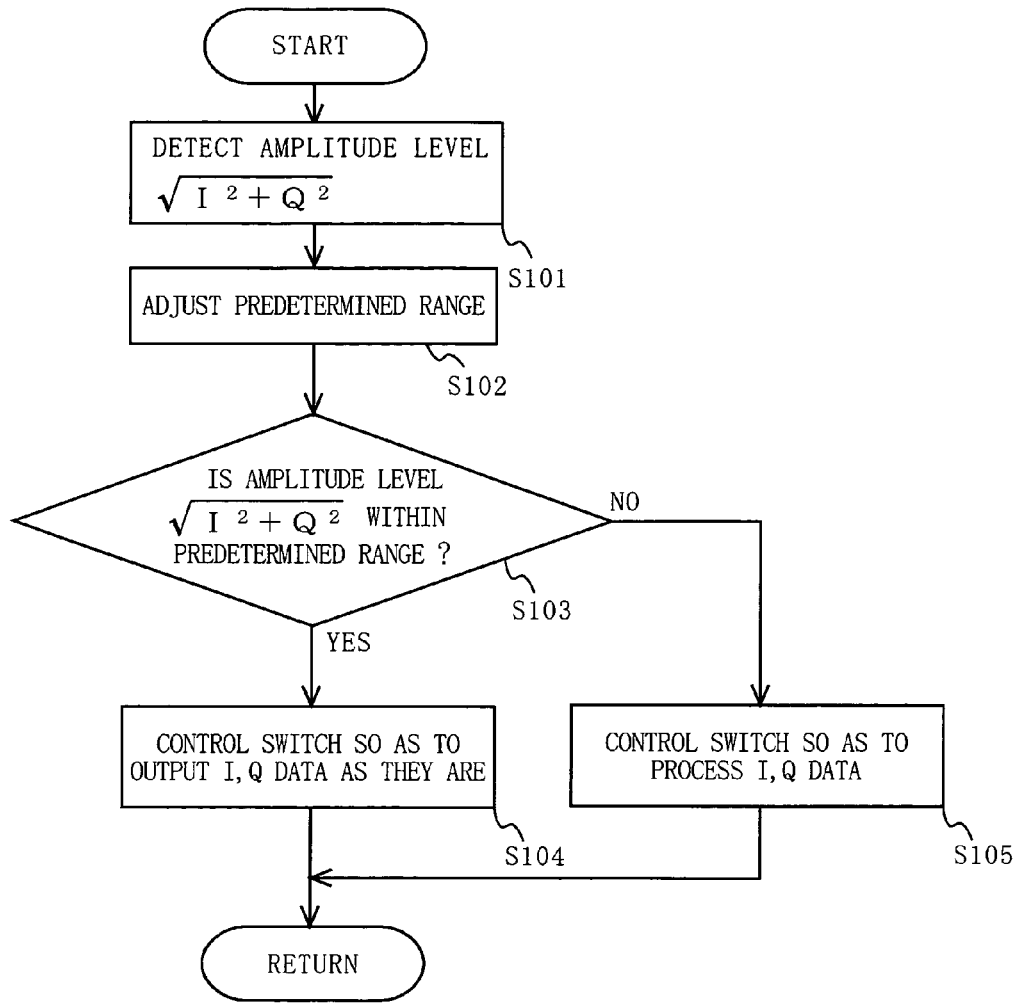
FIG. 5 is a flow chart showing an operation of the control section 111.

The control section 111 controls the switching of the switch section 113. FIG. 4 is a block diagram showing a functional configuration of the control section 111. Referring to FIG. 4, the control section 111 includes an amplitude detection section 111a, a region determination section 111b and the predetermined range adjustment section 111c. FIG. 5 is a flow chart showing an operation of the control section 111. Referring to FIG. 5, the operation of the control section 111 will now be described. First, the amplitude detection section 111a of the control section 111 detects $(I^2+Q^2)^{1/2}$, which is the amplitude level of the amplitude signal corresponding to the orthogonal data represented by I and Q data (step S101). Then, the predetermined range adjustment section 111c of the control section 111 adjusts the predetermined range based on information from an external control section indicating the gain of the variable-gain amplifier 150 (step S102). Then, the region determination section 111b of the control section 111 determines whether or not the obtained amplitude level $(I^2+Q^2)^{1/2}$ is within the predetermined range (step S103). Step S101 and step S102 may be performed in the reversed order or in parallel to each other.

There are a number of methods for determining whether or not the amplitude level is within the predetermined range. For example, a DSP (Digital Signal Processor) may be used as the control section 111 to obtain $(I^2+Q^2)^{1/2}$ from I and Q data, in which case the determination can be made by determining whether or not the obtained value exceeds a certain threshold value. Alternatively, a dedicated digital circuit for performing a threshold determination operation may be used as the control section 111. Alternatively, a dedicated analog circuit may be used as the control section 111, in which case the threshold determination can be made by means of diodes.

If the amplitude level is within the predetermined range, the region determination section 111b of the control section 111 controls the switch section 113 so that the I and Q data are outputted as they are (step S104).

If the amplitude level is not within the predetermined range, the region determination section 111b of the control section 111 controls the switch section 113 so that I2 and Q2 data, obtained by processing the I and Q data at the signal processing section 112, are outputted (step S105).

The data converter 110 is designed, with respect to the switching of the switch section 113, so that the delay for the path between the input side and the output side is matched with that for the path via the signal processing section 112. For example, where the data converter 110 is a DSP, if I and Q data are to be outputted as they are, the data converter 110 outputs the I and Q data after the passage of an amount of time that would otherwise be required for the signal processing at the signal processing section 112. Where the data converter 110 is a digital circuit or an analog circuit, a delay circuit for giving an amount of delay in time that would be required for the signal processing at the signal processing section 112 is inserted between the input terminal 101 and a terminal of the switch section 113 to which the signal processing section 112 is not connected.

As described above, the predetermined range for the value $(I^2+Q^2)^{1/2}$ is defined by the linear region of the amplifier 160. The linear region of the amplifier 160 is dictated by the level of the input power to the amplifier 160, i.e., the level of the amplitude signal inputted to the amplifier 160. A region where the output power and the passing phase stay linear (proportional) with respect to the input power is the linear region, and a region where the output power and the passing phase vary non-linearly (non-proportionally) with respect to the input power is the non-linear region.

For example, where the characteristics of the amplifier 160 are non-linear for input power levels greater than P1, the predetermined range is as follows:

$$0 \leq (I^2+Q^2)^{1/2} \leq a1$$

where a1 is the output amplitude from the data converter 110, which is uniquely determined by A1 (the power level of the output signal from the variable-gain amplifier 150 for the input power level P1) and a (the gain of the variable-gain amplifier 150).

The data converter 110 can know the gain α of the variable-gain amplifier 150 based on the information from an external control circuit (not shown) indicating the level of the power that the amplifier 160 is supposed to output (this applies throughout the following description).

Where the characteristics of the amplifier 160 are non-linear for input power levels less than P2, the predetermined range is as follows:

$$a2 \leq (I^2+Q^2)^{1/2} \leq b$$

where a2 is the output amplitude from the data converter 110, which is uniquely determined by A2 (the power level of the output signal from the variable-gain amplifier 150 for the input power level P2) and a (the gain of the variable-gain amplifier 150), and b is the output amplitude from the data converter 110, which is uniquely determined by B (the power level of the output signal from the variable-gain amplifier 150 for the maximum input power) and α.

Where the characteristics of the amplifier 160 are non-linear for input power levels less than P3 or greater than P4, the predetermined range is as follows:

$$a3 \leq (I^2+Q^2)^{1/2} \leq a4$$

where a3 is the output amplitude from the data converter 110, which is uniquely determined by A3 (the power level of the output signal from the variable-gain amplifier 150 for the input power level P3) and α (the gain of the variable-gain amplifier 150), and a4 is the output amplitude from the data converter 110, which is uniquely determined by A4 (the power level of the output signal from the variable-gain amplifier 150 for the input power level P4) and α.

The switch section 113 is controlled based on the control signal from the control section 111. If the switch section 113 is controlled so that the vector modulator 140 and the signal processing section 112 are connected to each other, the input signal is delta-sigma-modulated through the signal processing section 112 into I2 and Q2 data, which are inputted to the vector modulator 140. Otherwise, the I and Q data are inputted as they are to the vector modulator 140.

Figure 6:
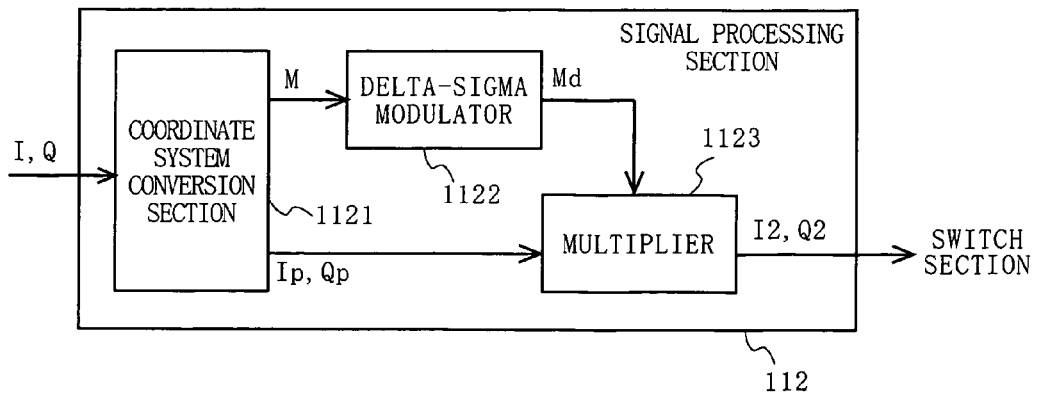
FIG. 6 is a block diagram showing an exemplary functional configuration of a signal processing section 112.

FIG. 6 is a block diagram showing an exemplary functional configuration of the signal processing section 112. Referring to FIG. 6, the signal processing section 112 includes a coordinate system conversion section 1121, a delta-sigma modulator 1122 and a multiplier 1123.

The coordinate system conversion section 1121 receives I and Q data being orthogonal data and converts them to amplitude data and phase data being data of a polar coordinate system. The coordinate system conversion section 1121 represents the phase data in the form of data of a rectangular coordinate system. Thus, the amplitude data M and the phase data Ip and Qp of a rectangular coordinate system are expressed by Expressions 1 to 3 below. Assume that the magnitude of the vector formed by Ip and Qp is constant.

$$M=(I+Q)^{1/2} \qquad \text{Exp. 1}$$

$$Ip=I/M \qquad \text{Exp. 2}$$

$$Qp=Q/M \qquad \text{Exp. 3}$$

The amplitude data M from the coordinate system conversion section 1121 is inputted to the delta-sigma modulator 1122. The delta-sigma modulator 1122 delta-sigma-modulates the received amplitude data M to output delta-sigma-modulated data Md. The delta-sigma-modulated signal Md is inputted to the multiplier 1123. The delta-sigma modulator 1122 may be a first-order delta-sigma modulator or a second-order delta-sigma modulator. The higher the order of the delta-sigma modulator is, the more it is possible to reduce the quantization noise near the intended wave frequency.

The orthogonal data Ip and Qp representing the phase data from the coordinate system conversion section 1121 are inputted to the multiplier 1123.

The multiplier 1123 multiplies the delta-sigma-modulated data Md by each of the orthogonal data Ip and Qp. Thus, the multiplier 1123 outputs data I2 and Q2 expressed by Expressions 4 and 5 below.

$$I2 = Md \times Ip \quad \text{Exp. 4}$$

$$Q2 = Md \times Qp \quad \text{Exp. 5}$$

Thus, the signal processing section 112 outputs the delta-sigma-modulated orthogonal data I2 and Q2. As the delta-sigma-modulated orthogonal data I2 and Q2 have been discretized with respect to the magnitude of the vector formed by the data I2 and Q2, they can be said to be data with lowered resolutions.

Where the output side of the data converter 110 and the signal processing section 112 are connected to each other via the switch section 113, the correction section 120 corrects the amplitude and phase values of the discretized orthogonal data from the signal processing section 112, and inputs the corrected data to the vector modulator 140. Where the output side and the input side of the data converter 110 are connected to each other via the switch section 113, the correction section 120 inputs the orthogonal data as it is to the vector modulator 140.

Figure 7A:
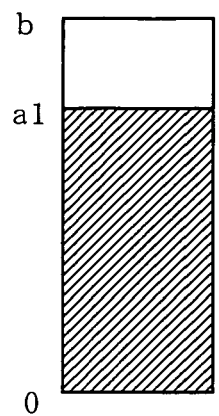
FIG. 7A shows in detail an operation of the data converter 110 where the predetermined range is $0 \leq (I^2+Q^2)^{1/2} \leq a1$.
Figure 7B:
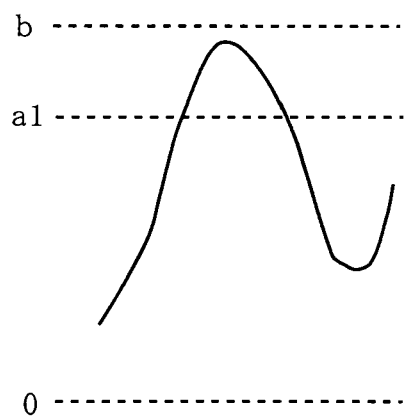
FIG. 7B shows in detail an operation of the data converter 110 where the predetermined range is $0 \leq (I^2+Q^2)^{1/2} \leq a1$.
Figure 7C:
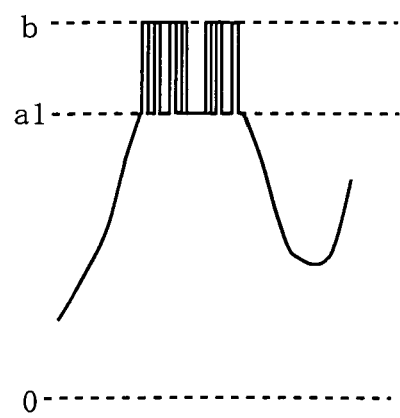
FIG. 7C shows in detail an operation of the data converter 110 where the predetermined range is $0 \leq (I^2+Q^2)^{1/2} \leq a1$.

FIG. 7A to FIG. 7C show in detail an operation of the data converter 110 where the predetermined range is $0 \leq (I^2+Q^2)^{1/2} \leq a1$. FIG. 7A schematically shows the predetermined range. In FIG. 7A, the hatched region represents a region within the predetermined range, and the open region represents a region outside the predetermined range. FIG. 7B shows the time waveform of the amplitude data obtained from the I and Q data inputted to the data converter 110. In the example shown in FIG. 7B, the time waveform includes a portion between the threshold values a1 and b, i.e., a portion outside the predetermined range. FIG. 7C shows the time waveform of the amplitude data outputted from the data converter 110. As shown in FIG. 7C, the data converter 110 does not perform signal processing within the predetermined range, but discretizes the portion of the signal outside the predetermined range through delta-sigma modulation at the signal processing section 112.

Figures 8, 9:
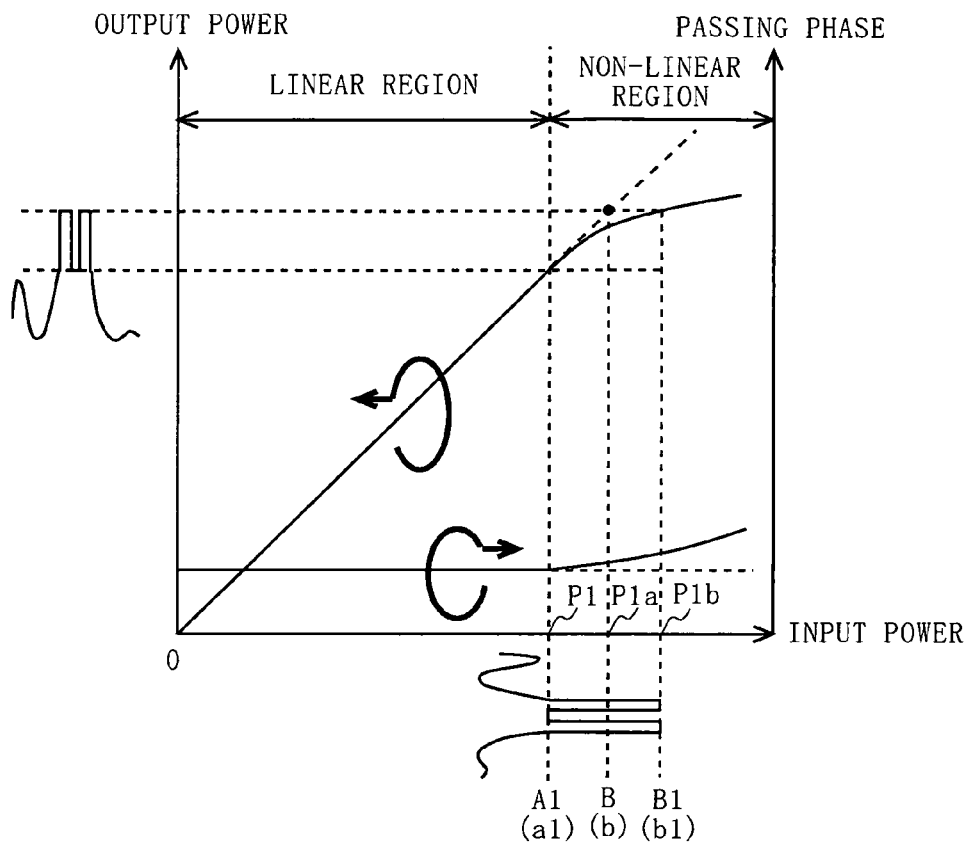
FIG. 8 shows in detail an operation of a correction section 120 and a reason why distortion is suppressed.
FIG. 9 shows a correction table where a predetermined range as shown in FIG. 7A is used.

FIG. 8 shows in detail an operation of the correction section 120 and a reason why distortion is suppressed. FIG. 9 shows an exemplary correction table where a predetermined range as shown in FIG. 7A is used. The correction table may be provided for each gain of the variable-gain amplifier 150, or may be obtained through an arithmetic operation based on the gain of the variable-gain amplifier 150.

In FIG. 8, A1 is the power level of the output signal from the variable-gain amplifier 150 for the input power level P1. The power level A1 corresponds to the amplitude level a1 of the orthogonal data before being amplified through the variable-gain amplifier 150. B is the power level of the output signal from the variable-gain amplifier 150 for the input power level P1a. The power level B corresponds to the amplitude level b of the orthogonal data before being amplified through the variable-gain amplifier 150. B1 is the power level of the output signal from the variable-gain amplifier 150 for the input power level P1b. The power level B1 corresponds to the amplitude level b1 of the orthogonal data before being amplified through the variable-gain amplifier 150.

The correction table section 130 shown in FIG. 9 contains a correction table such that an input amplitude level of b is corrected to b1 and a phase of θ to θ+θ1 for a gain of the variable-gain amplifier 150. The phase θ+θ1 is set to be opposite to the phase θ in order to suppress the inter-modulation distortion. Thus, the phase rotation amount for P1b is represented by −θ1.

Figure 10A:
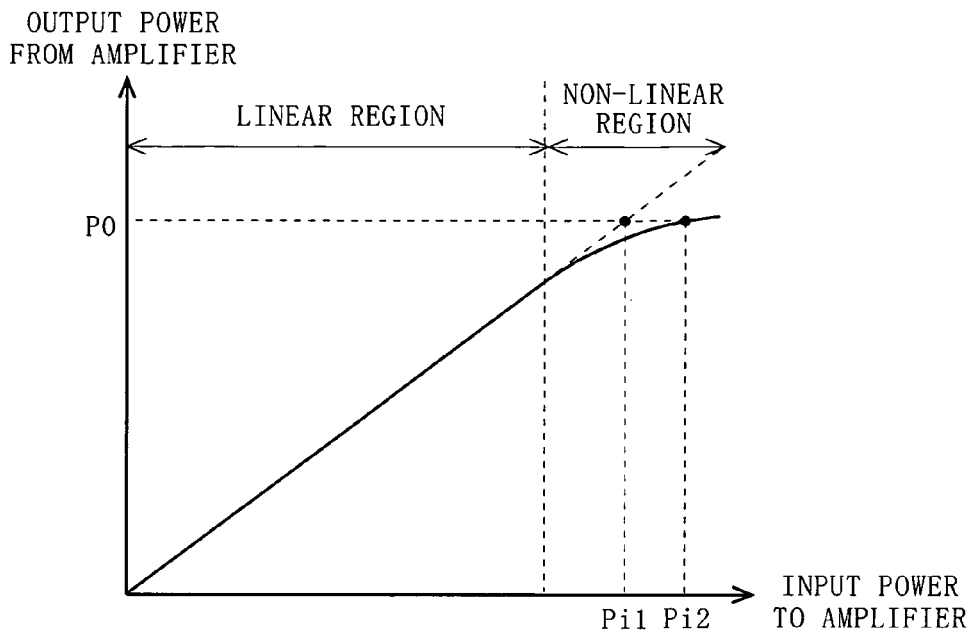
FIG. 10A is used to illustrate how to obtain b1.

FIG. 10A is used to illustrate how to obtain b1. An output power P0 can be obtained when the input power is Pi1 provided that the amplifier 160 is linear. However, the amplifier 160 is non-linear, and a higher input power Pi2 is needed to obtain the output power P0. The value b1 is the amplitude level of the orthogonal data corresponding to this input power, i.e., the output signal Pi2 from the variable-gain amplifier 150.

Figure 10B:
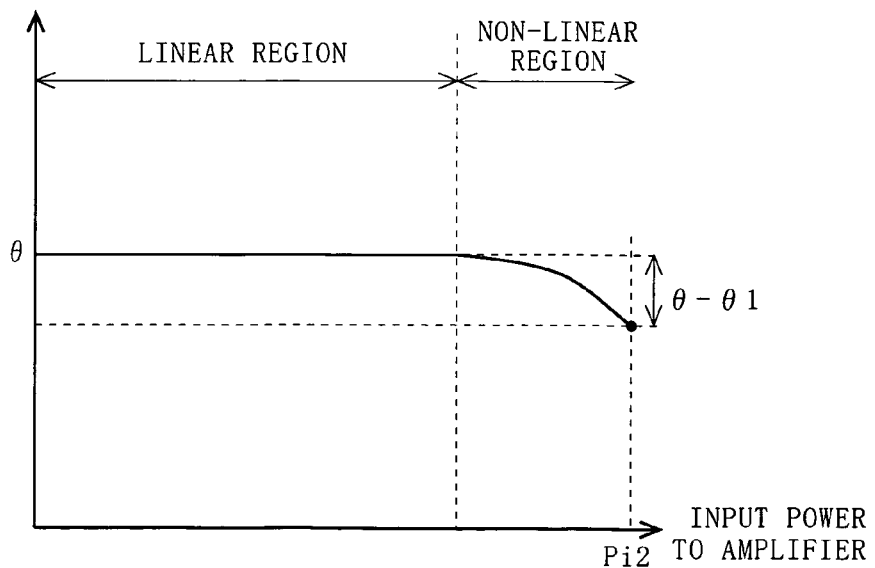
FIG. 10B is used to illustrate how to obtain a phase rotation amount θ1.

FIG. 10B is used to illustrate how to obtain the phase rotation amount θ1. Where the amplifier 160 has such characteristics that the phase is lagged as the input voltage increases, as shown in FIG. 10B, it can be seen that the phase is lagged by θ1 for the input voltage Pi2. Therefore, the corrected phase can be set to θ+θ1.

The correction section 120 refers to a correction table based on the gain of the variable-gain amplifier 150. The correction section 120 obtains the level of the amplitude inputted from the data converter 110. If the level of the orthogonal data is b and if the variable-gain amplifier 150 has a gain corresponding to the correction table shown in FIG. 9, the correction section 120 converts the input orthogonal data to data having a level of b1 and a phase of θ+θ1. Thus, the maximum power value of the discretized portion is B1 and the corresponding input power is P1b, as shown in FIG. 8. Therefore, the power P1b is supplied to the amplifier 160. Then, the output power for the input power P1b is equal to that which would otherwise result for the input power P1a if the amplifier 160 had an ideal linearity. Moreover, the correction section 120 converts the phase θ of the input orthogonal data to θ+θ1. Therefore, the linearity of the output power and that of the passing phase are maintained. Thus, the amplifier 160 can output signals that are not distorted.

As described above, in the first embodiment, the transmitter circuit detects the amplitude level of the orthogonal data being an input signal to the transmitter circuit, and determines whether or not the input power to the amplifier is in the non-linear region of the amplifier based on the detected amplitude level of the input signal. If the input power is in the non-linear region, the transmitter circuit outputs the input signal while reducing the resolution thereof. Therefore, the data converter of the first embodiment discretizes only portions of the input signal that have power levels in the non-linear region of the amplifier. Since only part of the input signal is discretized, the quantization noise is reduced as compared with a case where the whole of the input signal is discretized, as is the case in the prior art.

As the quantization noise is reduced, the amplifier no longer amplifies unnecessary signal portions, whereby it is possible to reduce the overall power consumption of the transmitter circuit.

Moreover, the relationship between the power and phase of the discretized input signal to the amplifier and those of the output signal from the amplifier for the discretized input signal is equal to the input/output relationship in the linear region, whereby no distortion occurs in the amplifier.

Moreover, the quantization noise is suppressed across the entire range, including the quantization noise near the intended wave frequency. Therefore, the filtering loss at the band-pass filter is reduced. Furthermore, it is no longer necessary to use a band-pass filter which has steep attenuation characteristics, whereby it is possible to reduce the power consumption of the transmitter circuit. As a result, the overall size of the transmitter circuit can also be reduced.

Moreover, in the present embodiment, the amplitude resolution is small, whereby the table size is considerably smaller than those in a case where a correction table is provided in a conventional transmitter circuit that does not convert data through a delta-sigma modulator.

It is typical in the art that the clock frequency for the discretization in the data converter is increased to reduce the quantization noise near the intended wave frequency. In the present invention, however, it is not necessary to increase the clock frequency at the data converter because the quantization noise is already reduced, whereby it is possible to reduce the power consumption of the data converter.

In the data converter 110 of the first embodiment, whether to perform low-resolution signal processing or to output a received signal as it is without performing signal processing is determined based on threshold determination. However, the present invention is not limited to this if data conversion is performed so as to reduce the resolution outside the predetermined range.

For example, the control section 111 may activate the signal processing section 112 if outside the predetermined range while not activating the signal processing section 112 if within the predetermined range. Then, the resolution outside the predetermined range is reduced.

Where the input signal is not discretized, the control section 111 may control the signal processing section 112 so as to decrease the interval between discrete values if within the predetermined range while controlling the signal processing section 112 so as to increase the interval between discrete values if outside the predetermined range. In other words, while input signals within predetermined range are outputted as they are in the description above, input signals within the predetermined range may also be quantized through signal processing with such a narrow interval that the quantization noise does not increase. This also reduces the resolution outside the predetermined range.

In the first embodiment, the delta-sigma modulator may be replaced with any other suitable modulator capable of signal discretization. For example, the modulator may be a delta modulator (DM) or a pulse width modulator (PWM).

If the quantization noise of the amplifier 160 is sufficiently low, the band-pass filter 170 may be omitted.

The operation of the data converter 110 as described above may be realized in the form of a computer program, which can be stored in a computer-readable recording medium, and read out and executed by a CPU. It similarly applies to other embodiments that the data converter 110 can be realized by a computer program and a CPU.

In the first embodiment, the correction section 120 corrects the amplitude and the phase of the orthogonal data by referring to a correction table. Alternatively, the correction section 120 may store characteristics curves of the amplifier 160 as shown in FIG. 10A and FIG. 10B, based on which the correction section 120 can calculate the corrected amplitude and phase of the orthogonal data.

Second Embodiment

Figure 11A:
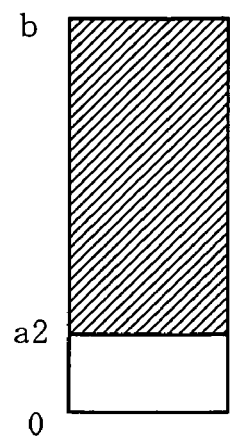
FIG. 11A shows in detail an operation of the data converter 110 according to the second embodiment of the present invention.
Figure 11B:
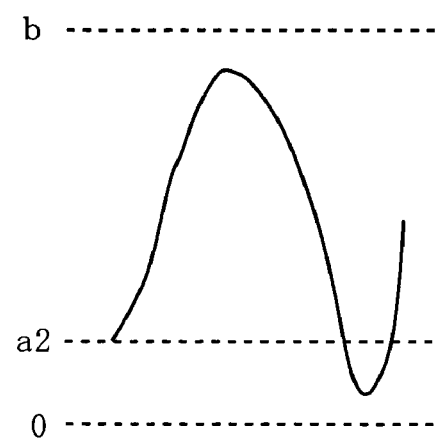
FIG. 11B shows in detail an operation of the data converter 110 according to the second embodiment of the present invention.
Figure 11C:
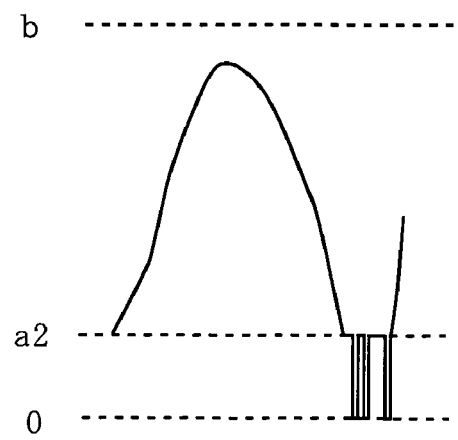
FIG. 11C shows in detail an operation of the data converter 110 according to the second embodiment of the present invention.

The second embodiment is directed to a configuration of a transmitter circuit using the amplifier 160 that has distortion for lower input power levels. Since the second embodiment is similar to the first embodiment except for the predetermined range, FIG. 1 and FIG. 3 to FIG. 6 are relied upon in the second embodiment. FIG. 11A to FIG. 11C show in detail an operation of the data converter 110 according to the second embodiment of the present invention. In the second embodiment, the predetermined range set in the data converter 110 is $a2 \leq (I^2+Q^2)^{1/2} \leq b$. As in the first embodiment, a2 and b are variable according to the gain of the variable-gain amplifier 150. FIG. 11A schematically shows the predetermined range. In FIG. 11A, the hatched region represents a region within the predetermined range, and the open region represents a region outside the predetermined range. FIG. 11B shows the time waveform of the amplitude data obtained from the I and Q data inputted to the data converter 110. In the example shown in FIG. 11B, the time waveform includes a portion outside the predetermined range defined between the threshold values a2 and b. FIG. 11C shows the time waveform of the amplitude data outputted from the data converter 110. As shown in FIG. 11C, the data converter 110 does not perform signal processing within the predetermined range, but discretizes the portion of the signal outside the predetermined range through delta-sigma modulation at the signal processing section 112.

Figure 12:
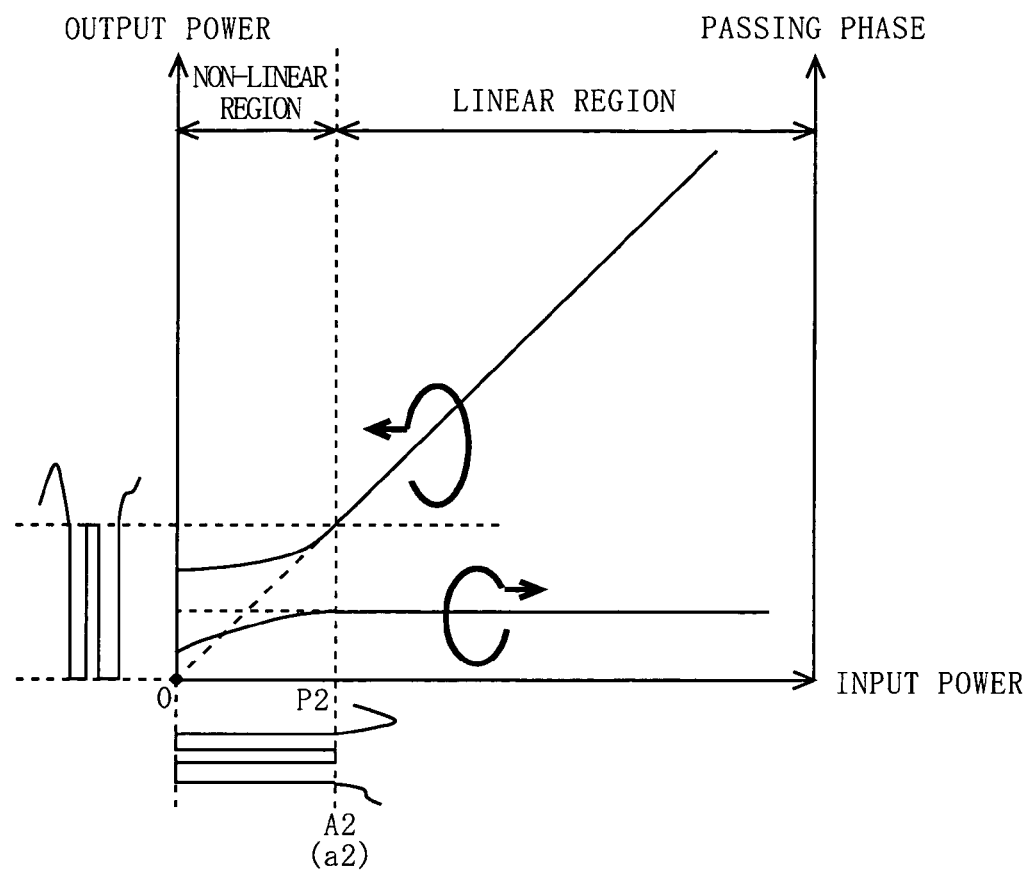
FIG. 12 shows in detail an operation of the correction section 120 according to the second embodiment and a reason why distortion is suppressed.

FIG. 12 shows in detail an operation of the correction section 120 according to the second embodiment and a reason why distortion is suppressed. Referring to FIG. 12, in the non-linear region, the input power is discretized into either one of two values of zero and P2. If the input power is discretized into zero, the output power will also be zero, whereby no distortion occurs. However, the second embodiment requires a circuit configuration such that no power at all is supplied to the amplifier 160 when the input power is zero. This can be realized by providing a switch circuit between the amplifier 160 and the variable-gain amplifier 150, wherein when the input power is zero, the control section of the data converter 110 turns OFF the switch so that no power at all is supplied to the amplifier 160.

As described above, in the second embodiment, the transmitter circuit detects the amplitude level of the orthogonal data being an input signal to the transmitter circuit, and determines whether or not the input power to the amplifier is in the non-linear region of the amplifier based on the detected amplitude level of the input signal. If the input power is in the non-linear region, the transmitter circuit outputs the input signal while reducing the resolution thereof. Therefore, only part of the input signal is discretized, whereby the quantization noise is reduced as compared with a case where the whole of the input signal is discretized, as is the case in the prior art. Moreover, the reduction in the quantization noise leads to other advantageous effects similar to those described above in the first embodiment.

Third Embodiment

Figure 13A:
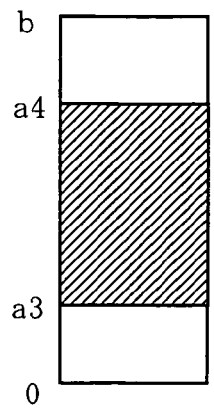
FIG. 13A shows in detail an operation of the data converter 110 according to the third embodiment of the present invention.
Figure 13B:
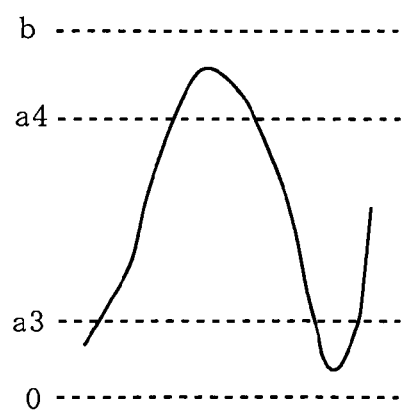
FIG. 13B shows in detail an operation of the data converter 110 according to the third embodiment of the present invention.
Figure 13C:
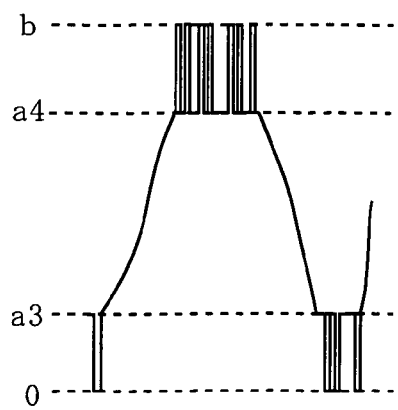
FIG. 13C shows in detail an operation of the data converter 110 according to the third embodiment of the present invention.

The third embodiment is directed to a configuration of a transmitter circuit using an amplifier that has distortion for high input power levels and low input power levels. Since the third embodiment is similar to the first embodiment except for the predetermined range, FIG. 1 and FIG. 3 to FIG. 6 are relied upon in the third embodiment. FIG. 13A to FIG. 13C show in detail an operation of the data converter 110 according to the third embodiment of the present invention. In the third embodiment, the predetermined range set in the data converter 110 is $a3 \leq (I^2+Q^2)^{1/2} \leq a4$. FIG. 13A schematically shows the predetermined range. In FIG. 13A, the hatched region represents a region within the predetermined range, and the open region represents a region outside the predetermined range. FIG. 13B shows the time waveform of the amplitude data obtained from the I and Q data inputted to the data converter 110. In the example shown in FIG. 13B, the time waveform includes portions outside the predetermined range defined between the threshold values a3 and a4. FIG. 13C shows the time waveform of the amplitude data outputted from the data converter 110. As shown in FIG. 13C, the data converter 110 does not perform signal processing within the predetermined range, but discretizes the portions of the signal outside the predetermined range at the signal processing section 112.

Figure 14:
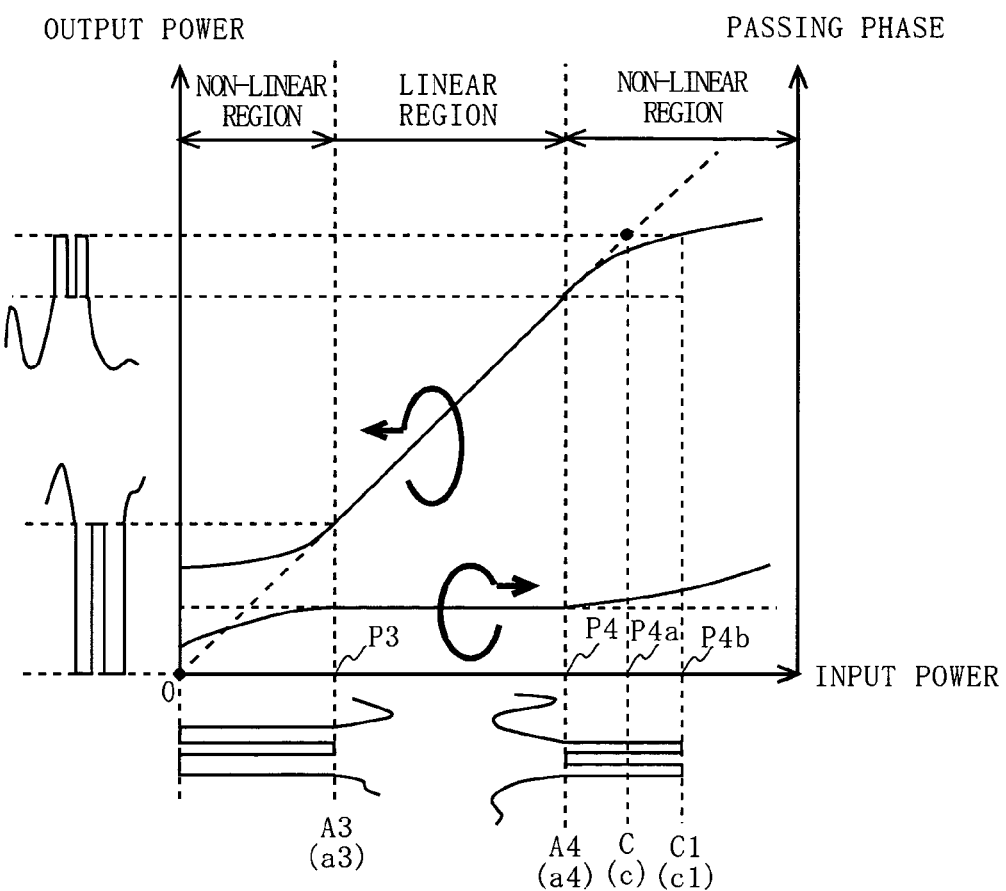
FIG. 14 shows in detail an operation of the correction section 120 according to the third embodiment and a reason why distortion is suppressed.

FIG. 14 shows in detail an operation of the correction section 120 according to the third embodiment and a reason why distortion is suppressed. Referring to FIG. 14, in one non-linear region for high input power levels, discretization and correction of the orthogonal data are performed as in the first embodiment. In the other non-linear region for low input power levels, discretization is performed as in the second embodiment. Thus, in the third embodiment, the quantization noise is reduced and distortion in the amplifier is suppressed.

In the first to third embodiments, the threshold value used in the data converter 110 is varied according to the gain of the variable-gain amplifier 150. Without taking the gain of the variable-gain amplifier 150 into consideration, a problem may occur as follows. For example, when the gain of the variable-gain amplifier 150 is ½, the input signal may be converted to a lower-resolution signal if the amplitude level is equal to or greater than the threshold value a1, even though the power to be inputted to the amplifier 160 is lowered. In such a case, the power inputted to the amplifier 160 is lowered by the variable-gain amplifier 150, whereby the input power may be in the linear region of the amplifier 160. In view of this, in the first to third embodiments, when the gain of the variable-gain amplifier 150 varies, the predetermined range set in the data converter 110 is varied accordingly. For example, with a threshold determination as shown in FIG. 7A, the threshold value a1 can be increased or decreased when the gain of the variable-gain amplifier 150 decreases or increases, respectively. With a threshold determination as shown in FIG. 11A, the threshold value a2 can be increased or decreased when the gain of the variable-gain amplifier 150 decreases or increases, respectively. With a threshold determination as shown in FIG. 13A, the threshold values a3 and a4 can be increased when the gain of the variable-gain amplifier decreases, and decreased when the gain increases.

In the first to third embodiments, the predetermined range is varied based on the information indicating the gain of the variable-gain amplifier 150. Alternatively, the data converter 110 may have a fixed predetermined range while the amplitude level of the orthogonal data is varied according to the gain of the variable-gain amplifier 150, and a determination is made as to whether or not the amplitude level of the orthogonal data is within the predetermined range. Thus, the data converter 110 can determine whether or not the input voltage to the amplifier 160 is in the non-linear region.

In a case where signals are amplified without using the variable-gain amplifier 150, the predetermined range may be a fixed range.

Fourth Embodiment

The fourth embodiment of the present invention differs from the first embodiment in the configuration of the signal processing section. The following description focuses on features that are different from the first embodiment.

Figure 15:
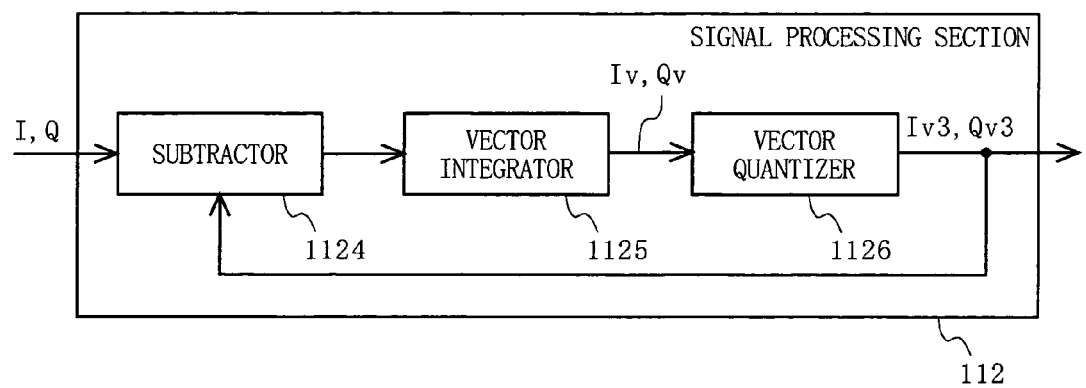
FIG. 15 is a block diagram showing a functional configuration of the signal processing section 112 according to the fourth embodiment of the present invention.

FIG. 15 is a block diagram showing a functional configuration of the signal processing section 112 according to the fourth embodiment of the present invention. Referring to FIG. 15, the signal processing section 112 includes a subtractor 1124, a vector integrator 1125 and a vector quantizer 1126.

The I and Q data inputted to the signal processing section 112 are passed to the vector integrator 1125 via the subtractor 1124. The vector integrator 1125 integrates the I data and the Q data vector-wise and outputs the results as Iv and Qv, respectively. Thus, if a stream of orthogonal data $(I_i, Q_i)$ (where i is a natural number) is inputted to the vector integrator 1125, the vector integrator 1125 outputs $(Iv, Qv) = (\Sigma I_i, \Sigma Q_i)$. The output from the vector integrator 1125 is inputted to the vector quantizer 1126.

The vector quantizer 1126 quantizes the magnitudes of the output vectors from the vector integrator 1125 and outputs the results as Iv3 and Qv3.

The quantization at the vector quantizer 1126 is performed as follows. In the following description, $q_n$ (where n is an integer of 1 or more) represents a discrete value of the magnitude of a vector, wherein $q_{n-1} < q_n$ if n is two or more. The vector quantizer 1126 receives (Iv, Qv) from the vector integrator 1125 to calculate $(Iv+Qv)^{1/2}$. Then, the vector quantizer 1126 obtains the maximum value of $q_n$ that satisfies Expression 6 below. Using the obtained value $q_n$, the vector quantizer 1126 then obtains output vectors Iv3 and Qv3 based on Expressions 7 and 8 below, respectively.

$$q_n \leq (Iv+Qv)^{1/2} \qquad \text{Exp. 6}$$

$$Iv3 = q_n \cdot Iv/(Iv+Qv)^{1/2} \qquad \text{Exp. 7}$$

$$Qv3 = q_n \cdot Qv/(Iv+Qv)^{1/2} \qquad \text{Exp. 8}$$

In other words, this quantization operation can be described as follows. The vector quantizer 1126 uses at least two discrete values. The vector quantizer 1126 obtains the maximum discrete value from among the at least two discrete values that is smaller than the magnitude of the vector formed by the input orthogonal data. Then, the vector quantizer 1126 obtains quantized Iv3 and Qv3 data so that the level of the vector-integrated orthogonal data is equal to the maximum discrete value and so that the phase of the vector-integrated orthogonal data is equal to that of the input orthogonal data.

The subtractor 1124 subtracts the output of the vector quantizer 1126 from the input data, and outputs the result to the vector integrator 1125.

Thus, in the fourth embodiment, part of the input signal is discretized, whereby the quantization noise can be reduced. Advantageous effects similar to those described above in the first embodiment are also provided.

Below is a specific example of how the quantization noise can be reduced by using the signal processing section 112 shown in FIG. 15 for converting data to be transmitted from a W-CDMA base station. In this example, the threshold value is set to a1 in the data converter 110 as shown in FIG. 7A so that the I and Q data are delta-sigma-modulated vector-wise only when the level of the orthogonal data is higher than a1. The oversampling frequency is 256 times the symbol rate, the peak of the input signal is limited at 10 dB, and the threshold value a1 is set to be 6 dB lower than the maximum power level of the input signal. Under these conditions, the proportion of the intended wave with respect to all the power was confirmed to be 97%. It can be seen that the quantization noise is reduced dramatically as compared with that in the prior art being 37%.

Figure 16A:
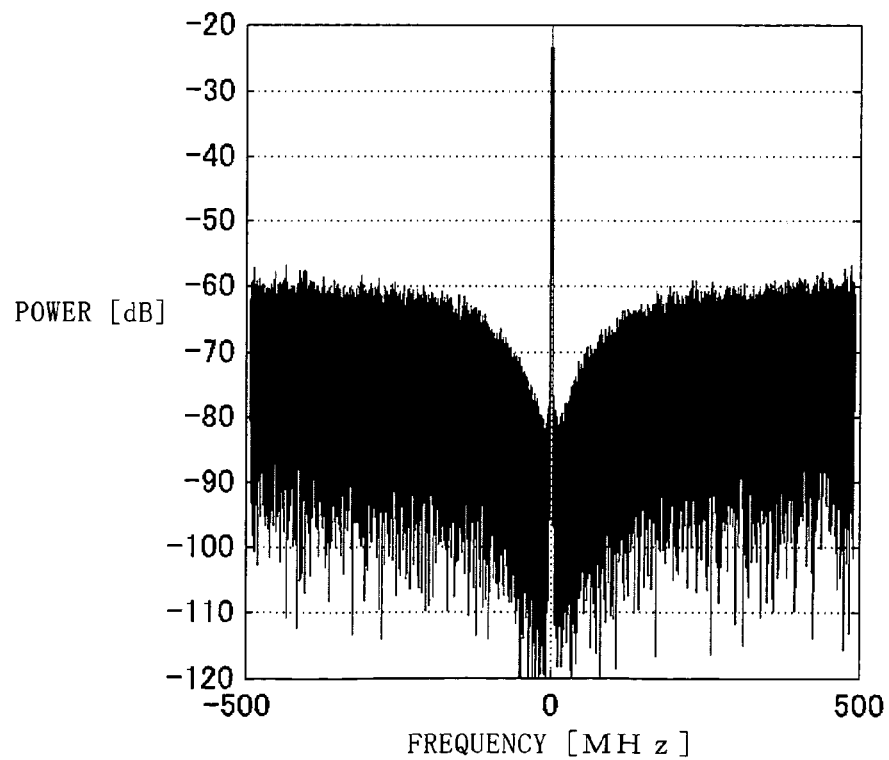
FIG. 16A shows a spectrum of an output signal from the data converter 110 where threshold determination is performed.
Figure 16B:
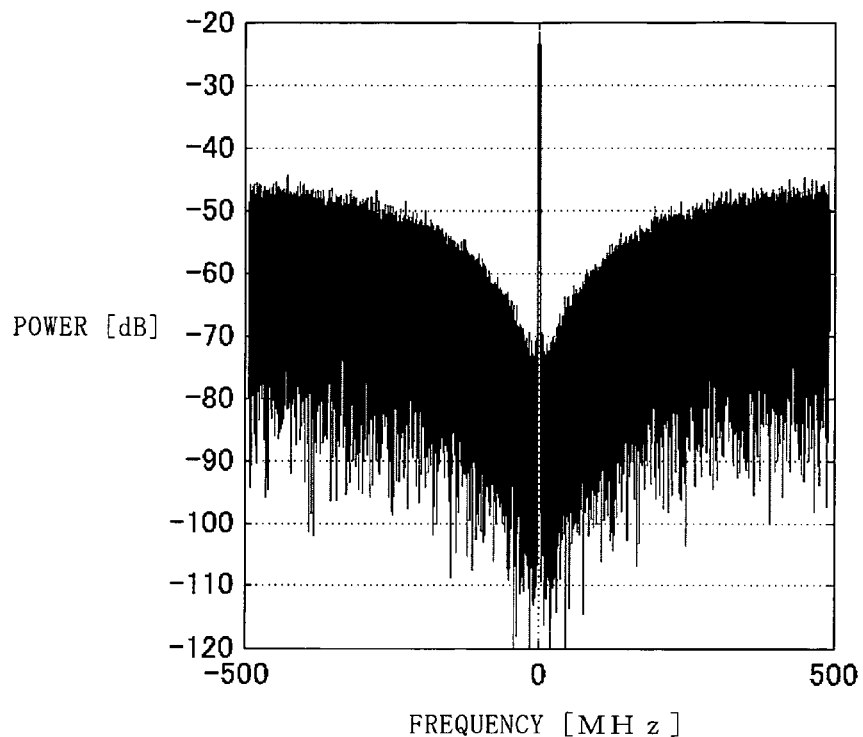
FIG. 16B shows a spectrum of an output signal from the data converter 110 where the signal is processed across the entire region.

FIG. 16A shows the spectrum of the output signal from the data converter 110 where threshold determination is performed under the conditions above. FIG. 16B shows the spectrum of the output signal from the data converter 110 where the signal is processed across the entire region. A comparison between FIG. 16A and FIG. 16B indicates that the quantization noise is better reduced in FIG. 16A both near the intended wave frequency and for the entire range.

Fifth Embodiment

Figure 17:
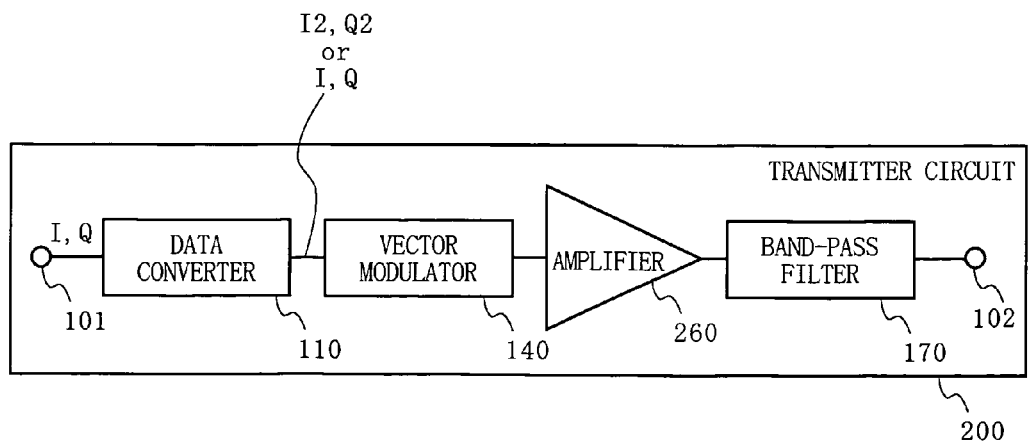
FIG. 17 is a block diagram showing a configuration of a transmitter circuit 200 according to the fifth embodiment of the present invention.

FIG. 17 is a block diagram showing a configuration of a transmitter circuit 200 according to the fifth embodiment of the present invention. Referring to FIG. 17, the transmitter circuit 200 includes the input terminal 101, the data converter 110, the vector modulator 140, an amplifier 260, the band-pass filter 170 and the output terminal 102. In FIG. 17, like components to those of the first embodiment are denoted by like reference numerals and will not be further described below. In FIG. 17, the variable-gain amplifier is omitted, and the data converter 110 uses a fixed predetermined range.

FIG. 18 shows the characteristics of the amplifier 260 and an operation of the transmitter circuit 200. Referring to FIG. 18, the characteristics of the amplifier 260 used in the fifth embodiment have points A1 and A2 for an input power of P1$a$ at which the proportional relationship between the input power and the output power is maintained as in the linear region.

Such an amplifier 260 does not require the provision of a correction section as in the first embodiment, and the data converter 110 can simply discretize the level of the orthogonal data into two values of a and b to obtain input powers P1 and P1$a$, thus suppressing the occurrence of distortion.

Also in the fifth embodiment, the predetermined range set in the data converter 110 may be varied according to the gain of the variable-gain amplifier 150 as in the first to third embodiments.

Also in the fifth embodiment, the predetermined range may be fixed while varying the amplitude level of the orthogonal data according to the gain, based on which the data converter 110 can determine whether or not the input power to the amplifier 160 is in the non-linear region.

Sixth Embodiment

Figure 19:
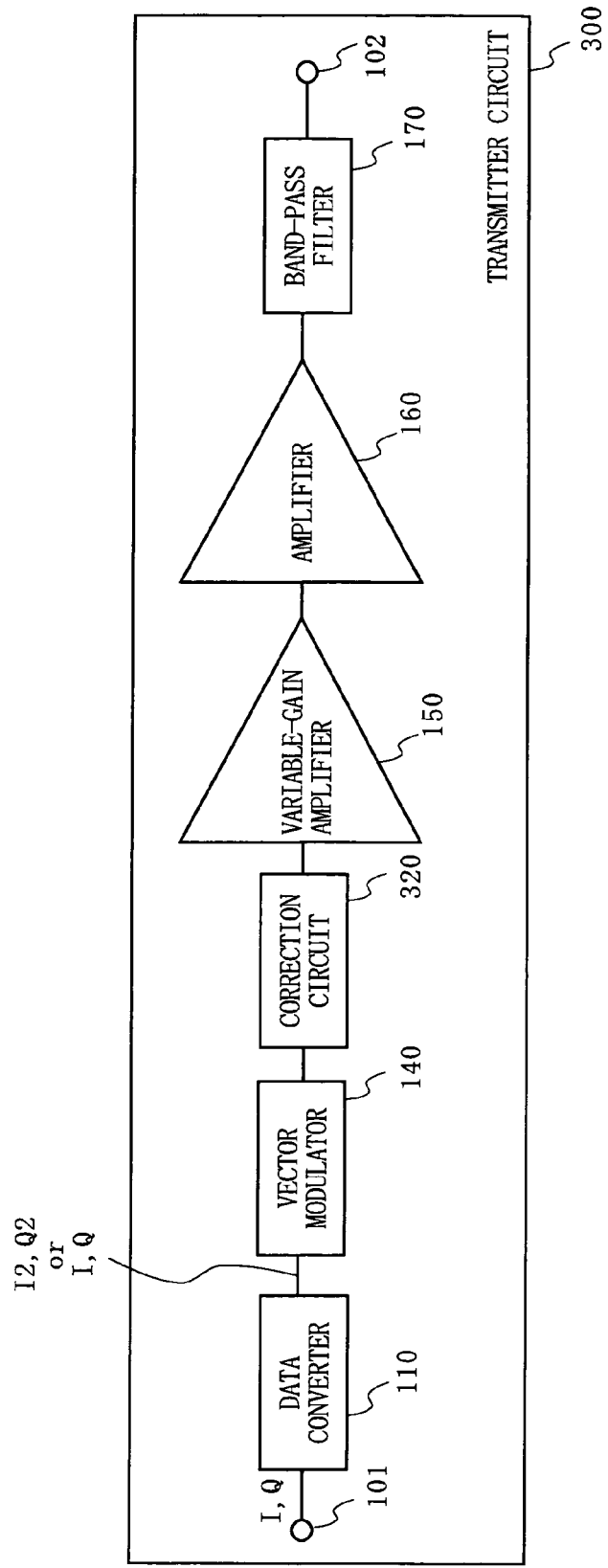
FIG. 19 is a block diagram showing a configuration of a transmitter circuit 300 according to the sixth embodiment of the present invention.

FIG. 19 is a block diagram showing a configuration of a transmitter circuit 300 according to the sixth embodiment of the present invention. Referring to FIG. 19, the transmitter circuit 300 includes the input terminal 101, the data converter 110, the vector modulator 140, a correction circuit 320, the variable-gain amplifier 150, the amplifier 160, the band-pass filter 170 and the output terminal 102. In FIG. 19, like components to those of the first embodiment are denoted by like reference numerals and will not be further described below.

In the sixth embodiment, the correction circuit 320 for correcting the distortion occurring at the amplifier 160 is provided preceding the variable-gain amplifier 150. The correction circuit 320 generates and outputs a signal having an equal amplitude and an opposite phase to those of the distortion component occurring at the amplifier 160. The equi-amplitude anti-phase signal from the correction circuit 320 is inputted to the amplifier 160 via the variable-gain amplifier 150. Thus, the distortion at the amplifier 160 can be suppressed as a signal having an equal amplitude and an opposite phase to those of the distortion component is inputted to the amplifier 160.

Figure 20:
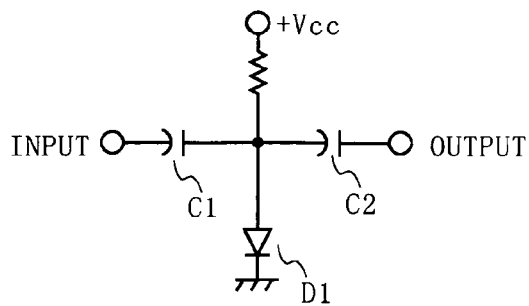
FIG. 20 shows an example of a correction circuit 320.
Figure 21:
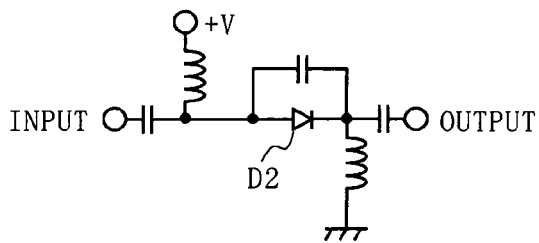
FIG. 21 shows another example of the correction circuit 320.
Figure 22:
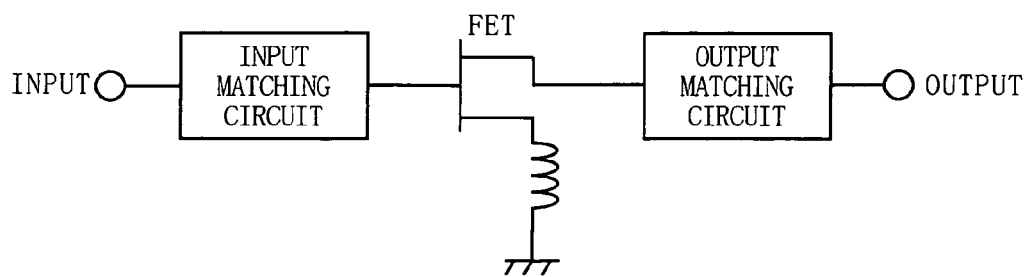
FIG. 22 shows still another example of the correction circuit 320.

FIG. 20 to FIG. 22 each show an example of the correction circuit 320. FIG. 20 shows a linearizer that generates an equi-amplitude anti-phase signal by utilizing the non-linearity of a diode D1. FIG. 21 shows a linearizer that generates an equi-amplitude anti-phase signal by utilizing the non-linearity of a diode D2. FIG. 22 shows a linearizer that generates an equi-amplitude anti-phase signal by utilizing the non-linearity of a FET.

Thus, in the sixth embodiment, a predistortion circuit configuration is provided, whereby it is possible to suppress the distortion component occurring at the amplifier 160.

Also in the sixth embodiment, as in the first to third embodiments, the data converter 110 varies the predetermined range based on the information indicating the gain of the variable-gain amplifier 150. Alternatively, the data converter 110 may use a fixed predetermined range. Also in the sixth embodiment, the predetermined range may be fixed while varying the amplitude level of the orthogonal data according to the gain, based on which the data converter 110 can determine whether or not the input power to the amplifier 160 is in the non-linear region.

Seventh Embodiment

Figure 23:
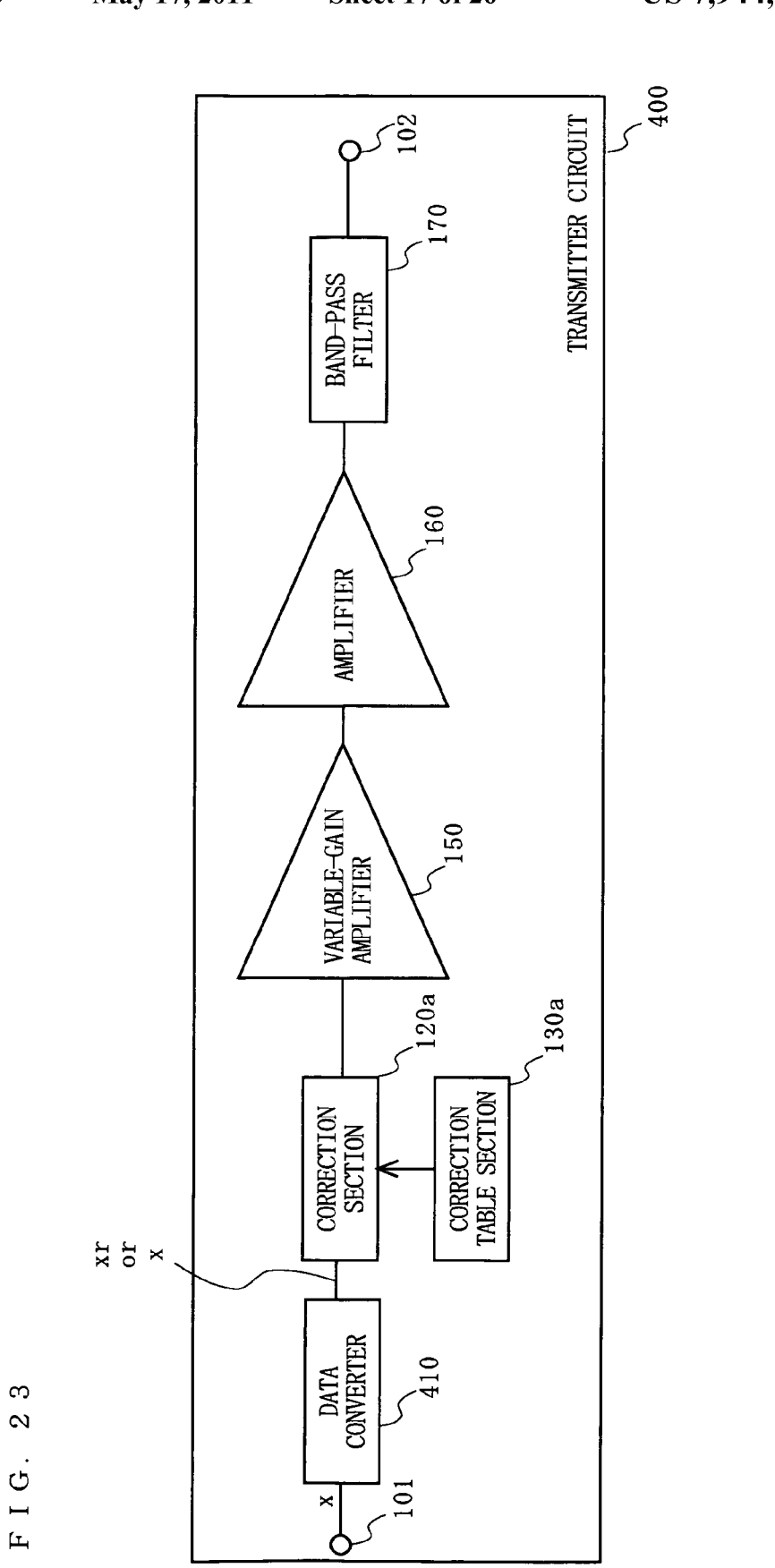
FIG. 23 is a block diagram showing a configuration of a transmitter circuit 400 according to the fifth embodiment of the present invention.

FIG. 23 is a block diagram showing a configuration of a transmitter circuit 400 according to the seventh embodiment of the present invention. Referring to FIG. 23, the transmitter circuit 400 includes the input terminal 101, a data converter 410, a correction section 120$a$, a correction table section 130$a$, the variable-gain amplifier 150, the amplifier 160, the band-pass filter 170 and the output terminal 102. In FIG. 23, like components to those of the first embodiment are denoted by like reference numerals and will not be further described below.

Since the basic configuration of the data converter 410 is similar to that shown in FIG. 3 and FIG. 4, FIG. 3 and FIG. 4 are relied upon in the seventh embodiment. The seventh embodiment differs from the first embodiment in that the data converter 410 processes the amplitude data, instead of the orthogonal data, as an input signal. Accordingly, the correction section 120$a$ corrects the level of the input signal (scalar quantity) based on signal level correction values defined in the correction table. In the seventh embodiment, the signal processing section 112 may be any suitable modulator capable of signal discretization, such as a delta-sigma modulator, a delta modulator or a PWM modulator.

Figure 24:
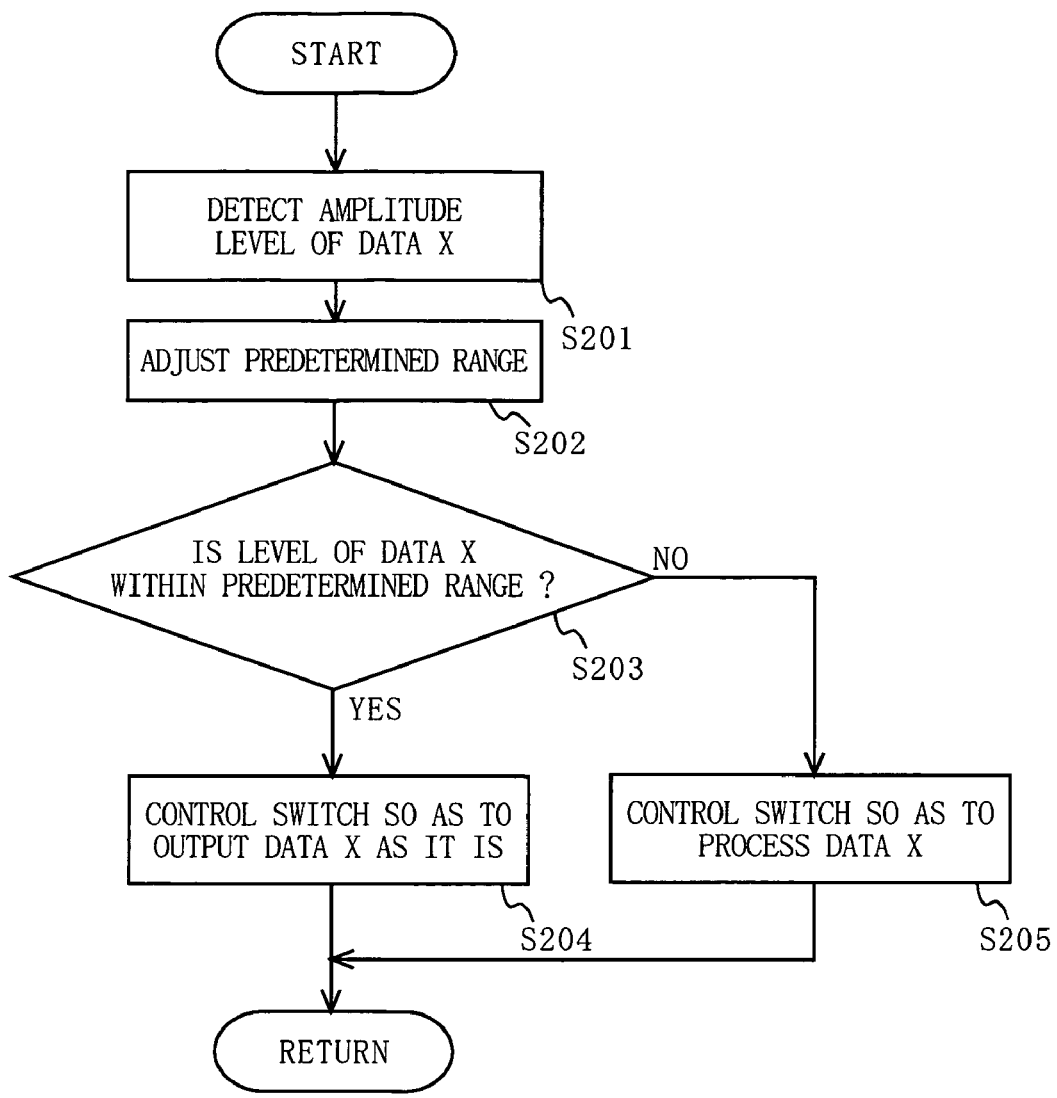
FIG. 24 is a flow chart showing an operation of the control section 111 in a data converter 410.

FIG. 24 is a flow chart showing an operation of the control section 111 in the data converter 410. First, the amplitude detection section 111$a$ of the control section 111 detects the amplitude level of amplitude data x being the input signal (step S201). Then, the predetermined range adjustment section 111$c$ of the control section 111 adjusts the predetermined range based on information from an external control section indicating the gain of the variable-gain amplifier 150 (step S202) Then, the region determination section 111$b$ of the control section 111 determines whether or not the detected amplitude level is within the predetermined range (step S203). The predetermined range is similar to that of the first embodiment except that the threshold value is determined based on the input amplitude data.

If the detected amplitude level is within the predetermined range, the region determination section 111$b$ of the control section 111 controls the switch section 113 so that the amplitude data x is outputted as it is (step S204). If the detected amplitude level is not within the predetermined range, the region determination section 111$b$ of the control section 111 controls the switch section 113 so that the amplitude data x is processed at the signal processing section 112 (step S205). Thus, if the power of the amplitude data x is outside the predetermined range, data xr having a lowered resolution is outputted. If the power of the amplitude data x is within the predetermined range, the amplitude data x is outputted as it is.

As described above, in the seventh embodiment, signals in the linear region of the amplifier are not processed while those in the non-linear region are processed and discretized. Therefore, only part of the amplitude signal is discretized, whereby the quantization noise can be reduced. Advantageous effects similar to those described above in the first embodiment are also provided.

Also in the seventh embodiment, the predetermined range may be a fixed range if signals are amplified without using the variable-gain amplifier 150. Alternatively, the predetermined range may be fixed while varying the level of the amplitude data according to the gain, based on which the data converter 410 can determine whether or not the input power to the amplifier 160 is in the non-linear region.

While a band-pass filter is used in the seventh embodiment, a low-pass filter may be used instead of the band-pass filter depending on the shape of the quantization noise at the delta-sigma modulator.

Eighth Embodiment

Figure 25:
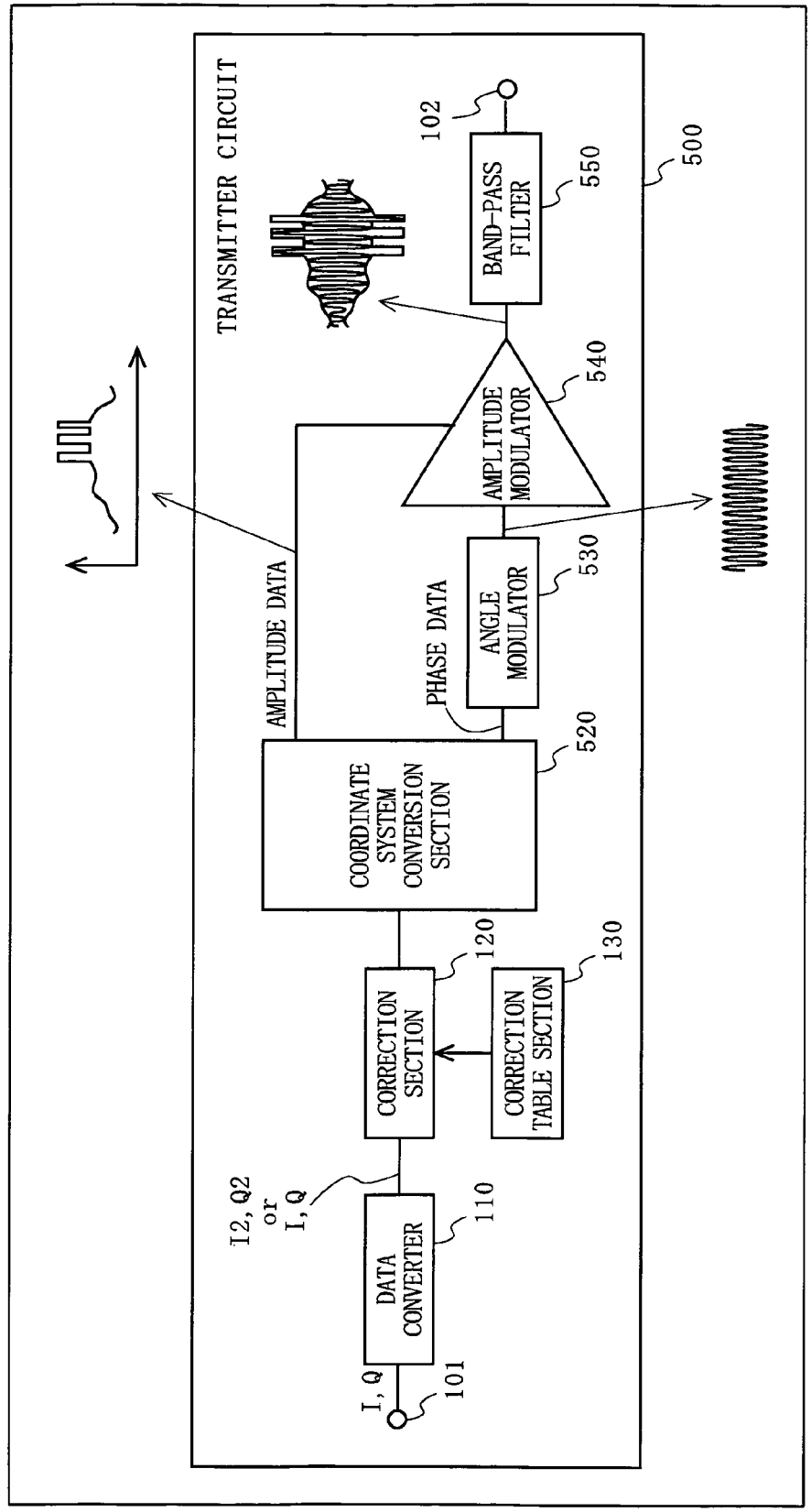
FIG. 25 is a block diagram showing a configuration of a transmitter circuit 500 according to the eighth embodiment of the present invention.

FIG. 25 is a block diagram showing a configuration of a transmitter circuit 500 according to the eighth embodiment of the present invention. Referring to FIG. 25, the transmitter circuit 500 includes the input terminal 101, the data converter 110, the correction section 120, the correction table section 130, a coordinate system conversion section 520, an angle modulator 530, an amplitude modulator 540, a band-pass filter 550 and the output terminal 102. In FIG. 25, like components to those of the first embodiment are denoted by like reference numerals and will not be described in detail below.

As in the first embodiment, the data converter 110 outputs an input baseband signal as it is if within the predetermined range, and converts the input baseband signal to a signal of a lowered resolution if outside the predetermined range.

A signal inputted to the input terminal 101 is converted through the data converter 110 as described above, and inputted to the correction section 120. The correction section 120 corrects the received signal, as in the first embodiment, and inputs the corrected signal to the coordinate system conversion section 520.

The coordinate system conversion section 520 converts the received baseband data of a rectangular coordinate system to data of a polar coordinate system, and outputs amplitude data and phase data.

The phase data is inputted to the angle modulator 530 where it is angle-modulated. The angle modulator 530 inputs the angle-modulated phase data to the amplitude modulator 540.

The amplitude data from the coordinate system conversion section 520 is inputted to the amplitude modulator 540.

At the amplitude modulator 540, the output signal from the angle modulator 530 is amplitude-modulated with the amplitude data from the coordinate system conversion section 520. The modulated signal is then inputted to the band-pass filter 550 where out-of-band quantization noise is removed, and the filtered signal is outputted via the output terminal 102.

As described above, in the fifth embodiment, signals in the linear region of the amplifier are not processed while those in the non-linear region are processed and discretized. Therefore, only part of the amplitude signal is discretized, whereby the quantization noise is reduced.

Also in the eighth embodiment, a variable-gain amplifier may be provided preceding the amplitude modulator 540 (between the angle modulator 530 and the amplitude modulator 540 or between the angle modulator 530 and the coordinate system conversion section 520), in which case the predetermined range set in the data converter 110 can be varied according to the gain of the variable-gain amplifier, as in the first to third embodiments. Alternatively, the predetermined range may be fixed while varying the amplitude level of the orthogonal data according to the gain, based on which the data converter 110 can determine whether or not the input power to the amplitude modulator 540 is in the non-linear region.

Ninth Embodiment

Figure 26:
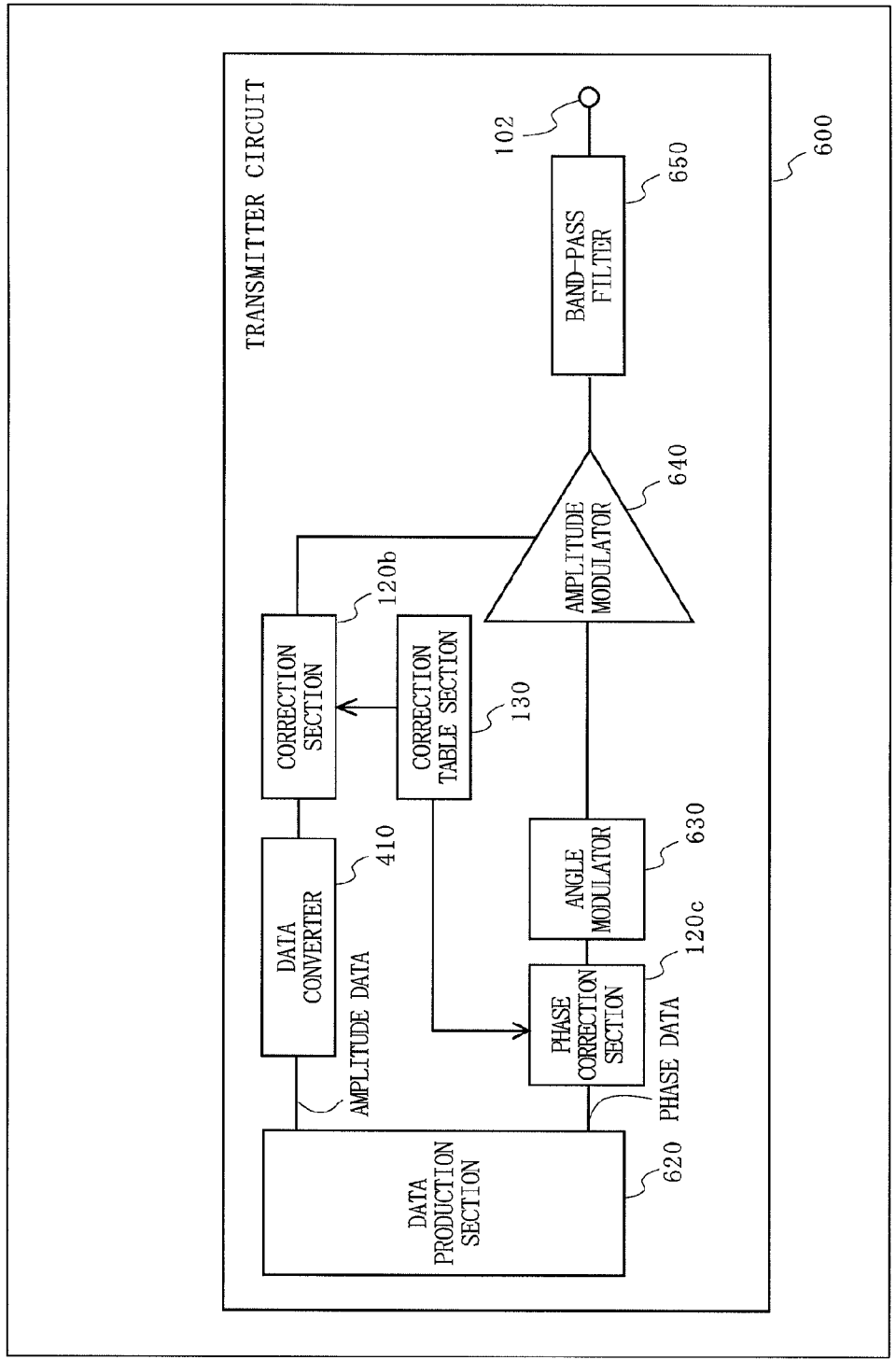
FIG. 26 is a block diagram showing a configuration of a transmitter circuit 600 according to the ninth embodiment of the present invention.

FIG. 26 is a block diagram showing a configuration of a transmitter circuit 600 according to the ninth embodiment of the present invention. Referring to FIG. 26, the transmitter circuit 600 includes a data production section 620, the data converter 410, an amplitude correction section 120b, a phase correction section 120c, the correction table section 130, an angle modulator 630, an amplitude modulator 640, a band-pass filter 650 and the output terminal 102. In the ninth embodiment, like components to those of the fourth embodiment are denoted by like reference numerals and will not be described in detail below.

The data production section 620 outputs amplitude data and phase data. The amplitude data is inputted to the data converter 410. The phase data from the data production section 620 is corrected at the phase correction section 120c to a phase defined in the correction table section 130, and is inputted to the angle modulator 630.

As in the fourth embodiment, the data converter 410 outputs the input baseband signal as it is if within the predetermined range, and converts the input baseband signal to a signal of a lowered resolution if outside the predetermined range.

The output from the data converter 410 is passed to the amplitude correction section 120b where the amplitude is corrected, and is inputted to the amplitude modulator 640.

The phase data from the data production section 620 is angle-modulated at the angle modulator 630, and is inputted to the amplitude modulator 640.

The amplitude modulator 640 amplitude-modulates the angle-modulated wave from the angle modulator 630 with a signal from the data converter 410. The output signal from the amplitude modulator 640 is passed to the band-pass filter 650 where out-of-band quantization noise is removed, and the filtered signal is outputted via the output terminal 102.

As described above, in the ninth embodiment, signals in the linear region of the amplifier are not processed while those in the non-linear region are processed and discretized. Therefore, only part of the amplitude signal is discretized, whereby the quantization noise is reduced.

Also in the ninth embodiment, a variable-gain amplifier may be provided preceding the amplitude modulator 640 (between the angle modulator 630 and the amplitude modulator 640 or between the angle modulator 630 and the phase correction section 120c), in which case the predetermined range set in the data converter 410 can be varied according to the gain of the variable-gain amplifier, as in the first to third embodiments. Alternatively, the predetermined range may be fixed while varying the level of the amplitude data according to the gain, based on which the data converter 410 can determine whether or not the input power to the amplifier 160 is in the non-linear region.

Assume that the amplitude modulators 540 and 640 of the eighth and ninth embodiments have characteristics as shown in FIG. 12, for example. Where the lower limit voltage of the linear region is P2, the data converters 110 and 410 perform an operation so that the supply voltage to the amplitude modulators 540 and 640 is either zero or P2 if the input power level is less than or equal to the threshold value a2. Thus, the data converters 110 and 410 discretize the input signal into zero and P2 in a region below the threshold value a2. This eliminates the influence of the non-linearity for voltages below P2, thus realizing a low distortion level.

Assume that the amplitude modulators 540 and 640 of the eighth and ninth embodiments have characteristics as shown in FIG. 14, for example. Where the lower limit voltage of the linear region is P3 and the upper limit voltage thereof is P4, the data converters 110 and 410 perform an operation so that the supply voltage to the amplitude modulators 540 and 640 is either zero or P3 if the input power level is less than or equal to the threshold value a3. Thus, the data converters 110 and 410 discretize the input signal into zero and P3 in a region below the threshold value a3. This eliminates the influence of the non-linearity for voltages below P3, thus realizing a low distortion level. If the input power level is equal to or greater than the threshold value a4, the data converters 110 and 410 perform an operation so that the supply voltage to the amplitude modulators 540 and 640 is either P4 or P4b. Thus, the data converters 110 and 410 discretize the input signal into P4 and P4b in a region above the threshold value a4. This eliminates the influence of the non-linearity for voltages above P3, thus realizing a low distortion level.

In the eighth and ninth embodiments, the band-pass filters 550 and 650 may be omitted if the quantization noise of the signal outputted from the amplitude modulators 540 and 640 is sufficiently low.

In the eighth and ninth embodiments, a correction circuit for correcting the distortion may be provided preceding the amplitude modulator 540, as in the sixth embodiment.

While input signals are quantized into two values of zero and a positive real number in the embodiments above, they may alternatively be quantized into more than two values.

FIG. 27A is a block diagram showing a functional configuration of an audio device 700 using a data converter of the present invention. Referring to FIG. 27A, the audio device 700 includes the data converter 110 (or 410), the amplifier 160, a filter 701 and a speaker 702. The data converter 110 (or 410) is a data converter of the present invention. Any of the variations described above may be applied to the data converter 110 (or 410). The filter 701 is typically a low-pass filter. The audio device 700 shown in FIG. 27A does not use a variable-gain amplifier. However, a variable-gain amplifier may be used, in which case the data converter 110 (or 410) adjusts the predetermined range according to the gain thereof. If it is determined that the input power to the amplifier 160 is in the non-linear region, the data converter 110 (or 410) converts an input signal of audio data (which may be either orthogonal data or amplitude data) to a signal having a lower resolution than the input signal. The amplifier 160 amplifies the signal outputted from the data converter 110 (or 410). The signal amplified through the amplifier 160 is passed via the filter 701 to the speaker 702 where it is converted into sound. Thus, it is possible to provide an audio device with suppressed quantization noise and reduced power consumption.

FIG. 27B is a block diagram showing a functional configuration of a video device 800 using a data converter of the present invention. Referring to FIG. 27B, the video device 800 includes the data converter 110 (or 410), the amplifier 160, a filter 801 and a display 802. The data converter 110 (or 410) is a data converter of the present invention. Any of the variations described above may be applied to the data converter 110 (or 410). The filter 801 is typically a low-pass filter. The video device 800 shown in FIG. 27B does not use a variable-gain amplifier. However, a variable-gain amplifier may be used, in which case the data converter 110 (or 410) adjusts the predetermined range according to the gain thereof. If it is determined that the input power to the amplifier 160 is in the non-linear region, the data converter 110 (or 410) converts an input signal of video data (which may be either orthogonal data or amplitude data) to a signal having a lower resolution than the input signal. The amplifier 160 amplifies the signal outputted from the data converter 110 (or 410). The signal amplified through the amplifier 160 is passed via the filter 801 to the display 802 where it is converted into a video image and/or sound. Thus, it is possible to provide a video device with suppressed quantization noise and reduced power consumption.

The data converter of the present invention may be used in any electronic device that uses an amplifier, and the applications of the data converter of the present invention are not limited to communications devices, audio devices and video devices.

While the input signal to the data converter of the present invention is a digital signal in the embodiments described above, it may alternatively be an analog signal. Also in a case where the input signal is an analog signal, the data converter of the present invention can determine whether or not the input voltage to the amplifier is in the non-linear region by determining whether or not the amplitude of the analog signal is in the predetermined range.

With the data converter of the present invention, it is possible to suppress the quantization noise and to reduce the power consumption, and the data converter of the present invention can be used in various applications, including communications devices such as mobile telephones and wireless LAN devices, and other electronic devices such as audio devices and video devices.

While the invention has been described in detail, the foregoing description is in all aspects illustrative and not restrictive. It is understood that numerous other modifications and variations can be devised without departing from the scope of the invention.

What is claimed is:

1. A quadrature modulation transmitter circuit for producing a modulated signal from I data and Q data which are input signals by a vector modulator, and amplifying the modulated signal by an amplifier to produce a signal to be transmitted, the quadrature modulation transmitter circuit comprising:
    an amplitude detection section that calculates an amplitude level of the input signal from a square root of a sum of squares of the I data and Q data;
    a region determination section that compares the amplitude level of the input signal which is calculated by said amplitude detection section with a predetermined threshold value so as to determine that an input power to the amplifier is in a linear region or a non-linear region of the amplifier, and determines that the input power to the amplifier is in the non-linear region of the amplifier if the amplitude level of the input signal is larger than the predetermined threshold value; and
    a data converter that, if said region determination section determines that the input power to the amplifier is in the non-linear region of the amplifier, discretizes using a first discretizing method the square root of the sum of the squares of the I data and Q data into at least two discrete values which are equal to or larger than the predetermined threshold value, or if said region determination section determines that the input power to the amplifier is in the linear region of the amplifier, discretizes using a second discretizing method the I data and Q data into discrete values having an interval therebetween narrower than an interval between the at least two discrete values discretized using the first discretizing method, and outputs the discretized I data and the discretized Q data to the vector modulator, wherein
    said data converter includes:
        a signal processing section which, if said region determination section determines that the input power to the amplifier is in the non-linear region of the amplifier, discretizes using the first discretizing method the square root of the sum of the squares of the I data and Q data into at least two discrete values which are equal to or larger than the predetermined threshold value, or if said region determination section determines that the input power to the amplifier is in the linear region of the amplifier, discretizes using the second discretizing method the I data and Q data into discrete values having the interval therebetween narrower than the interval between the at least two discrete values discretized using the first discretizing method and outputs the discretized I data and the discretized Q data; and a switch section which, if said region determination section determines that the input power to the amplifier is in the non-linear region of the amplifier, outputs the discretized I data and Q data which are obtained by discretizing using the first discretizing method, by said signal processing section, the square root of the sum of squares of the I data and Q data into at least two discrete values that are equal to or larger than the predetermined threshold value, and if said region determination section determines that the input power to the amplifier is in the linear region of the amplifier, outputs the discretized I data and Q data which are obtained by discretizing using the second discretizing method, by the signal processing section, the I data and Q data into discrete values having the interval therebetween narrower than the interval between the at least two discrete values discretized using the first discretizing method, the amplifier amplifies, with a constant power supply, an output of the vector modulator.

2. The quadrature modulation transmitter circuit according to claim 1, further comprising:

a correction table section in which the discretized I data and the discretized Q data are respectively associated in advanced with correction I data and correction Q data that suppresses distortion which is generated when the discretized I data and the discretized Q data are inputted to the amplifier via the vector modulator; and a correction section that refers to said correction table section, converts the discretized I data and the discretized Q data into the correction I data and the correction Q data, and outputs the correction I data and the correction Q data to the vector modulator.

3. The quadrature modulation transmitter circuit according to claim 1, wherein:

said data converter includes a delta-sigma modulator; and if said region determination section determines that the input power to the amplifier is in the non-linear region of the amplifier, the delta-sigma modulator discretizes using the first discretizing method the square root of the sum of the squares of the I data and Q data into the at least two discrete values which are equal to or larger than the predetermined threshold value.

4. The quadrature modulation transmitter circuit according to claim 1, further comprising:

a variable-gain amplifier that amplifies a signal to be inputted to the amplifier; and a control section that increases a gain of the variable-gain amplifier and decreases the predetermined threshold value if said region determination section determines that the input power to the amplifier is in the non-linear region of the amplifier, and decreases the gain of said variable-gain amplifier and increases the predetermined threshold value if said region determination section determines that the input power to the amplifier is not in the non-linear region of the amplifier.

5. The quadrature modulation transmitter circuit according to claim 1, further comprising a filter connected at a position subsequent to the amplifier.

6. A quadrature modulation transmitter circuit for producing a modulated signal from I data and Q data which are input signals by a vector modulator, and amplifying the modulated signal by an amplifier to produce a signal to be transmitted, the quadrature modulation transmitter circuit comprising:

an amplitude detection section that calculates an amplitude level of the input signal from a square root of a sum of squares of the I data and Q data;

a region determination section that compares the amplitude level of the input signal which is calculated by said amplitude detection section with a predetermined threshold value and so as to determine that an input power to the amplifier is in a linear region or a non-linear region of the amplifier, and determines that the input power to the amplifier is in the non-linear region of the amplifier if the amplitude level of the input signal is larger than the predetermined threshold value; and a data converter that, if said region determination section determines that the input power to the amplifier is in the linear region of the amplifier, outputs the I data and Q data as they are, if said region determination section determines that the input power to the amplifier is in the non-linear region of the amplifier, discretizes the square root of the sum of the squares of the I data and Q data into at least two discrete values which are equal to or greater than the predetermined threshold value, and outputs the discretized I data and the discretized Q data to the vector modulator, wherein the amplifier amplifies, with constant power supply, an output of the vector modulator, said data converter comprises:

a subtractor that receives the I data and the Q data;

a vector integrator connected to the subtractor that integrates the I data and the Q data, respectively; and a vector quantizer that quantizes the I data and the Q data, which has been integrated by the vector integrator, so that magnitudes of vectors formed by the integrated I data and the integrated Q data are equal to a maximum discrete value among the at least two discrete values that is smaller than magnitudes of vectors formed by the input I data and the input Q data and so that phases of the integrated I data and the integrated Q data are equal to those of the input I data and the input Q data; and the subtractor subtracts the I data and the Q data, which has been obtained through quantization by the vector quantizer, from the input I data and the input Q data.

7. A polar coordinate modulation transmitter circuit for converting I data and Q data, which are input signals, into polar coordinate system data by a coordinate system conversion section to produce amplitude data and phase data, and for amplitude-modulating an angle-modulated signal which is produced from the phase data by an amplitude modulator based on the amplitude data to produce a signal to be transmitted, the polar coordinate modulation transmitter circuit comprising:

an amplitude detection section that calculates, from a square root of a sum of squares of the I data and the Q data, a level of the amplitude data of the input signal;

a region determination section that compares the level of the amplitude data which is calculated by said amplitude detection section with a predetermined threshold value so as to determine that an input power to the amplitude modulator is in a linear region or a non-linear region of the amplitude modulator, and determines that the input power to the amplitude modulator is in the non-linear region of the amplitude modulator if the level of the amplitude data is smaller than the predetermined threshold value;

a data converter that, if said region determination section determines that the input power to the amplitude modulator is in the non-linear region of the amplitude modulator, discretizes using a first discretizing method the level of the amplitude data into at least two discrete values which are equal to or smaller than the predetermined threshold value, or if said region determination section determines that the input power to the amplitude modulator is in the linear region of the amplitude modulator, discretizes using a second discretizing method the level of the amplitude data into discrete values having an interval therebetween narrower than an interval between the at least two discrete values discretized using the first discretizing method, and outputs the discretized amplitude data to the coordinate system conversion section; and an angle modulator that produces, from the phase data which the coordinate system conversion section outputs based on an output of said data converter, the angle-modulated signal having a constant amplitude, wherein said data converter includes:

a signal processing section which, if said region determination section determines that the input power to the amplitude modulator is in the non-linear region of the amplitude modulator, discretizes using the first discretizing method the level of the amplitude data into at least two discrete values which are equal to or larger than the predetermined threshold value, or if said region determination section determines that the input power to the amplitude modulator is in the linear region of the amplitude modulator, discretizes using the second discretizing method the level of the amplitude data into discrete values having the interval therebetween narrower than the interval between the at least two discrete values discretized using the first discretizing method, and outputs the discretized amplitude data; and a switch section which, if said region determination section determines that the input power to the amplitude modulator is in the non-linear region of the amplitude modulator, outputs the discretized amplitude data which is obtained by discretizing using the first discretizing method, by said signal processing section, the level of the amplitude data into at least two discrete values which are equal to or larger than the predetermined threshold value, and if said region determination section determines that the input power to the amplitude modulator is in the linear region of the amplitude modulator, outputs the discretized amplitude data which is obtained by discretizing using the second discretizing method, by the signal processing section, the level of the amplitude data into discrete values having the interval therebetween narrower than the interval between the at least two discrete values discretized using the first discretizing method, and the amplitude modulator amplitude-modulates the angle-modulated signal having the constant amplitude, based on the amplitude data outputted from said data converter.

8. The polar coordinate modulation transmitter circuit according to claim 7, further comprising:

a correction table section in which the discretized amplitude data is associated in advance with correction amplitude data that suppresses distortion which is generated when the discretized amplitude data is inputted to the amplitude modulator; and a correction section that refers to said correction table section, converts the discretized amplitude data into the correction amplitude data, and outputs the correction amplitude data to the amplitude modulator.

9. The polar coordinate modulation transmitter circuit according claim 7, wherein:

said data converter includes a delta-sigma modulator; and if said region determination section determines that the input power to the amplitude modulator is in the non-linear region of the amplitude modulator, the delta-sigma modulator discretizes using the first discretizing method the level of the amplitude data into the at least two discrete values which are equal to or smaller than the predetermined threshold value.

10. The polar coordinate modulation transmitter circuit according to claim 7, further comprising:

a variable-gain amplifier that amplifies a signal to be inputted to the amplitude modulator; and a control section that decreases a gain of said variable-gain amplifier and increases the predetermined threshold value if said region determination section determines that the input power to the amplitude modulator is in the non-linear region of the amplitude modulator, and increases the gain of the variable-gain amplifier and decreases the predetermined threshold value if said region determination section determines that the input power to the amplitude modulator is not in the non-linear region of the amplitude modulator.

11. The polar coordinate modulation transmitter circuit according to claim 7, further comprising a filter connected at a position subsequent to the amplitude modulator.

12. A polar coordinate modulation transmitter circuit for producing amplitude data and phase data from an input signal, amplitude-modulating an angle-modulated signal which is produced from the phase data by an amplitude modulator based on the amplitude data to produce a signal to be transmitted, the polar coordinate modulation transmitter circuit comprising:

a data production section that produces the amplitude data and the phase data from the input signal;

an angle modulator that angle-modulates the phase data which is produced by said data production section to produce the angle-modulated signal having a constant amplitude;

a region determination section that compares a level of the amplitude data which is produced by said data production section with a predetermined threshold value so as to determine that an input power to the amplitude modulator is in a linear region or a non-linear region of the amplitude modulator, and determines that the input power to the amplitude modulator is in the non-linear region of the amplitude modulator if the level of the amplitude data is smaller than the predetermined threshold value; and a data converter that, if said region determination section determines that the input power to the amplitude modulator is in the non-linear region of the amplitude modulator, discretizes using a first discretizing method the level of the amplitude data into at least two discrete values which are equal to or smaller than the predetermined threshold value, or if said region determination section determines that the input power to the amplitude modulator is in the linear region of the amplitude modulator, discretizes using a second discretizing method the level of the amplitude data into discrete values having an interval therebetween narrower than an interval between the at least two discrete values discretized using the first discretizing method, and outputs the discretized amplitude data to the amplitude modulator, wherein
said data converter includes:
  a signal processing section which, if said region determination section determines that the input power to the amplitude modulator is in the non-linear region of the amplitude modulator, discretizes using the first discretizing method the level of the amplitude data into at least two discrete values which are equal to or larger than the predetermined threshold value, or if said region determination section determines that the input power to the amplitude modulator is in the linear region of the amplitude modulator, discretizes using the second discretizing method the level of the amplitude data into discrete values having the interval therebetween narrower than the interval between the at least two discrete values discretized using the first discretizing method, and outputs the discretized amplitude data; and
  a switch section which, if said region determination section determines that the input power to the amplitude modulator is in the non-linear region of the amplitude modulator, outputs the discretized amplitude data which is obtained by discretizing using the first discretizing method, by said signal processing section, the level of the amplitude data into at least two discrete values which are equal to or larger than the predetermined threshold value, and if said region determination section determines that the input power to the amplitude modulator is in the linear region of the amplitude modulator, outputs the discretized amplitude data which is obtained by discretizing using the second discretizing method, by the signal processing section, the level of the amplitude data into discrete values having the interval therebetween narrower than the interval between the at least two discrete values discretized using the first discretizing method, and
  the amplitude modulator amplitude-modulates the angle-modulated signal having the constant amplitude, based on the amplitude data outputted from said data converter.

13. The polar coordinate modulation transmitter circuit according to claim 12, further comprising:
  a correction table section in which the discretized amplitude data is associated in advance with correction amplitude data for suppressing distortion which is generated when the discretized amplitude data is inputted to the amplitude modulator; and
  a correction section that refers to said correction table section, converts the discretized amplitude data into the correction amplitude data, and outputs the correction amplitude data to the amplitude modulator.

14. The polar coordinate modulation transmitter circuit according to claim 13, wherein;
  said correction table section further stores information for correcting the phase data; and
  the transmitter circuit further comprises a phase correction section that refers to said correction table section, converts the phase data which is produced by said data production section into correction phase data, and outputs the correction phase data to the amplitude modulator.

15. The polar coordinate modulation transmitter circuit according to claim 12, further comprising a filter connected at a position subsequent to the amplitude modulator.

16. A method for producing amplitude data and phase data from an input signal, and amplitude-modulating an angle-modulated signal which is produced from the phase data by an amplitude modulator based on the amplitude data to produce a signal to be transmitted, the method comprising:
  obtaining the phase data from I data and Q data, and angle-modulating the phase data to produce the angle-modulated signal having a constant amplitude;
  calculating, from a square root of a sum of squares of the I data and the Q data, a level of the amplitude data of the input signal;
  comparing the level of the calculated amplitude data with a predetermined threshold value for determining that an input power to the amplitude modulator is in a linear region or a non-linear region of the amplitude modulator, and if the input power to the amplitude modulator is in the non-linear region of the amplitude modulator, discretizing using a first discretizing method the level of the amplitude data into at least two discrete values which are equal to or larger than the predetermined threshold value, or if input power to the amplitude modulator is in the linear region of the amplitude modulator, discretizes using a second discretizing method the level of the amplitude data into discrete values having an interval therebetween narrower than an interval between the at least two discrete values discretized using the first discretizing method, and outputting, to the amplitude modulator, the discretized amplitude data; and
  amplitude-modulating the angle-modulated signal having the constant amplitude, by the amplitude modulator based on the amplitude data, wherein
said step of outputting the amplitude data to the amplitude modulator includes the steps of:
  discretizing using the first discretizing method the level of the amplitude data into at least two discrete values which are equal to or larger than the predetermined threshold value, and discretizing using the second discretizing method the level of the amplitude data into discrete values having the interval therebetween narrower than the interval between the at least two discrete values discretized using the first discretizing method; and
  outputting the discretized amplitude data, and performing switching so as to output the discretized amplitude data which is obtained by discretizing using the first discretizing method the level of the amplitude data into at least two discrete values which are equal to or larger than the predetermined threshold value and output the discretized amplitude data which is obtained by discretizing using the second discretizing method the level of the amplitude data into discrete values having the interval therebetween narrower than the interval between the at least two discrete values discretized using the first discretizing method.

17. A method for producing amplitude data and phase data from an input signal, and amplitude-modulating an angle-modulated signal which is produced from the phase data by an amplitude modulator based on the amplitude data to produce a signal to be transmitted, the method comprising:

obtaining the phase data from I data and Q data, and angle-modulating the phase data to produce the angle-modulated signal having a constant amplitude;

calculating, from a square root of a sum of squares of the I data and the Q data, a level of the amplitude data of the input signal;

comparing the level of the calculated amplitude data with a predetermined threshold value for determining that an input power to the amplitude modulator is in a linear region or a non-linear region of the amplitude modulator, and if the input power to the amplitude modulator is in non-linear region of the amplitude modulator, discretizing using a first discretizing method the level of the amplitude data into at least two discrete values which are equal to or larger than the predetermined threshold value, or if the input power to the amplitude modulator is in the linear region of the amplitude modulator, discretizes using a second discretizing method the level of the amplitude data into discrete values having an interval therebetween narrower than an interval between the at least two discrete values discretized using the first discretizing method, and outputting, to the amplitude modulator, the discretized amplitude data; and amplitude-modulating the angle-modulated signal having the constant amplitude, by the amplitude modulator based on the amplitude data, wherein said step of outputting the amplitude data to the amplitude modulator includes the steps of:

discretizing using the first discretizing method the level of the amplitude data into at least two discrete values which are equal to or larger than the predetermined threshold value, and discretizing using the second discretizing method the level of the amplitude data into discrete values having the interval therebetween narrower than the interval between the at least two discrete values discretized using the first discretizing method; and outputting the discretized amplitude data, and performing switching so as to output the discretized amplitude data which is obtained by discretizing using the first discretizing method the level of the amplitude data into at least two discrete values which are equal to or larger than the predetermined threshold value and output the discretized amplitude data which is obtained by discretizing using the second discretizing method the level of the amplitude data into discrete values having the interval therebetween narrower than the interval between the at least two discrete values discretized using the first discretizing method.

* * * * *